(12) United States Patent
Ishiduki et al.

(10) Patent No.: US 9,548,315 B2
(45) Date of Patent: Jan. 17, 2017

(54) NONVOLATILE SEMICONDUCTOR MEMORY DEVICE, METHOD OF MANUFACTURING THE SAME, AND METHOD OF MEASURING THE SAME

(71) Applicant: KABUSHIKI KAISHA TOSHIBA, Minato-ku (JP)

(72) Inventors: Megumi Ishiduki, Yokkaichi (JP); Murato Kawai, Yokkaichi (JP); Tadashi Iguchi, Yokkaichi (JP); Yoshihiro Yanai, Yokkaichi (JP); Takuya Inatsuka, Yokkaichi (JP); Yoichi Minemura, Yokkaichi (JP); Takuya Mizutani, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/850,422

(22) Filed: Sep. 10, 2015

(65) Prior Publication Data

US 2016/0315094 A1 Oct. 27, 2016

Related U.S. Application Data

(60) Provisional application No. 62/152,375, filed on Apr. 24, 2015.

(51) Int. Cl.

| | |
|---|---|
| *H01L 27/115* | (2006.01) |
| *H01L 23/528* | (2006.01) |
| *H01L 23/532* | (2006.01) |
| *H01L 21/027* | (2006.01) |
| *H01L 21/311* | (2006.01) |
| *H01L 21/3213* | (2006.01) |

(Continued)

(52) U.S. Cl.
CPC ...... *H01L 27/11582* (2013.01); *H01L 21/0273* (2013.01); *H01L 21/31144* (2013.01); *H01L 21/32139* (2013.01); *H01L 21/76805* (2013.01); *H01L 21/76885* (2013.01); *H01L 22/12* (2013.01); *H01L 23/528* (2013.01); *H01L 23/53257* (2013.01); *H01L 23/53295* (2013.01); *H01L 27/11521* (2013.01); *H01L 27/11526* (2013.01); *H01L 27/11556* (2013.01); *H01L 27/11568* (2013.01); *H01L 27/11573* (2013.01)

(58) Field of Classification Search
None
See application file for complete search history.

(56) References Cited

U.S. PATENT DOCUMENTS

| | | | |
|---|---|---|---|
| 7,936,004 B2 | 5/2011 | Kito et al. | |
| 8,822,285 B2 | 9/2014 | Hwang et al. | |
| 2007/0252201 A1 | 11/2007 | Kito et al. | |

*Primary Examiner* — Armando Rodriquez
(74) *Attorney, Agent, or Firm* — Oblon, McClelland, Maier & Neustadt, L.L.P.

(57) ABSTRACT

A nonvolatile semiconductor memory device comprises: a memory cell region having a memory cell disposed therein; a peripheral region including a first stepped structure in which an end of a lower first layer is further from the memory cell region than is an end of an upper first layer; and a second stepped structure disposed on the first stepped structure, in which an end of a lower third layer is disposed further from the memory cell region than is an end of an upper third layer, a length in a second direction being shorter than a length in the second direction of the first layer or the second layer contacted by the second stepped structure, and a length in a third direction of the second stepped structure being shorter than a length in the third direction of the first layer or the second layer contacted by the second stepped structure.

20 Claims, 22 Drawing Sheets

(51) Int. Cl.
*H01L 21/768* (2006.01)
*H01L 21/66* (2006.01)

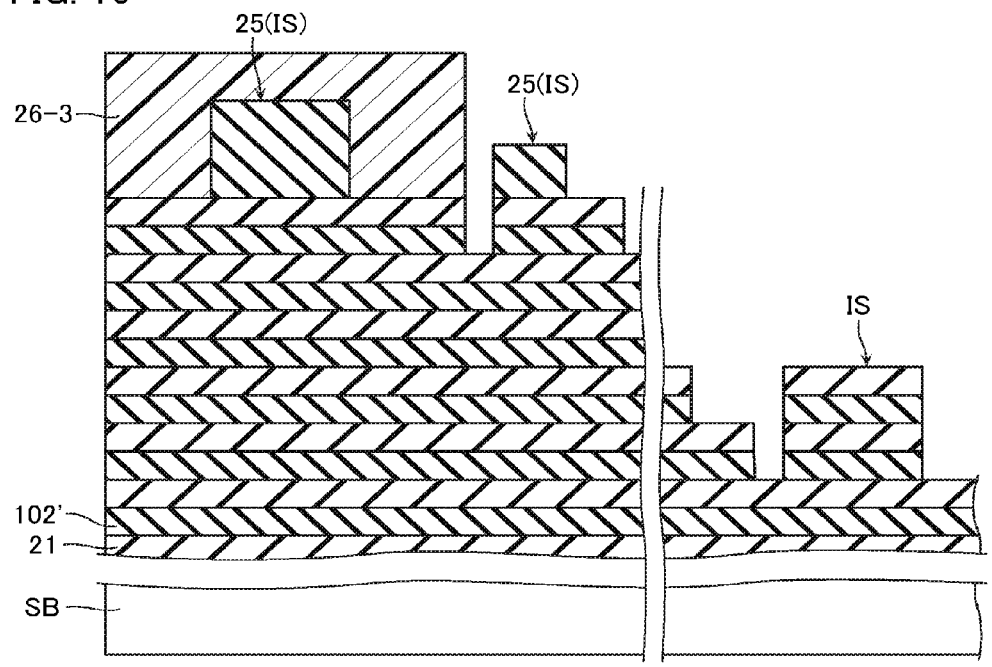
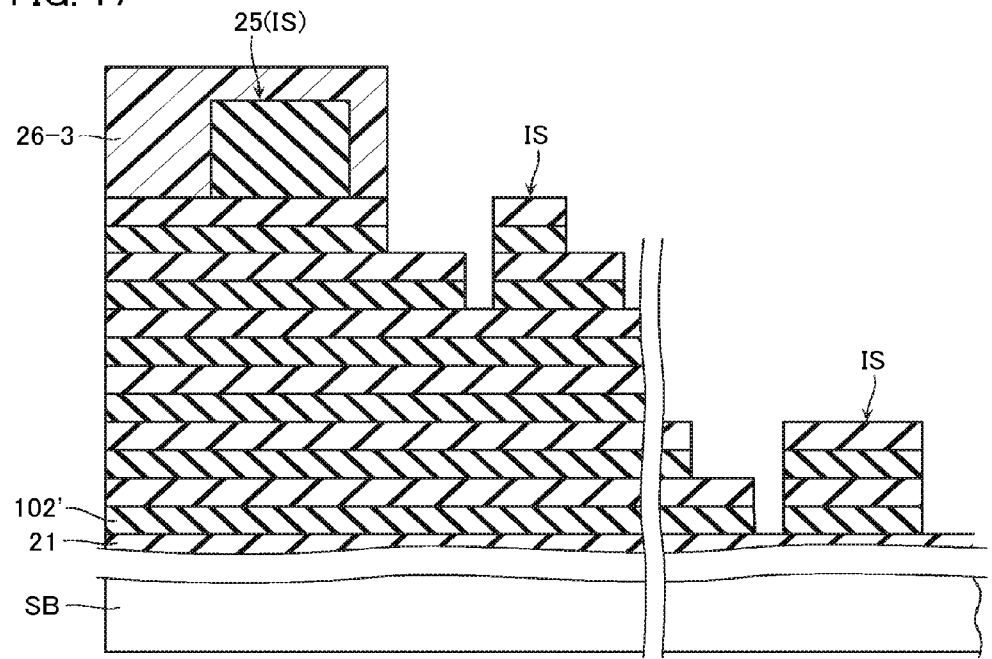

NONVOLATILE SEMICONDUCTOR MEMORY DEVICE, METHOD OF MANUFACTURING THE SAME, AND METHOD OF MEASURING THE SAME

CROSS REFERENCE TO RELATED APPLICATION

This application is based upon and claims the benefit of priority from U.S. Provisional Patent Application No. 62/152,375, filed on Apr. 24, 2015, the entire contents of which are incorporated herein by reference.

FIELD

Embodiments described below relate to a nonvolatile semiconductor memory device and a method of manufacturing the same.

BACKGROUND

In the field of NAND type flash memory, a stacked type (three-dimensional type) NAND type flash memory has been attracting attention in recent years as a device which allows a high level of integration to be achieved without being restricted by a limit of resolution of lithography technology. This kind of three-dimensional type NAND type flash memory comprises a stacked body having alternately stacked therein a plurality of conductive films. Moreover, formed in a periphery of the stacked body so as to surround the stacked body is a peripheral region configured from a stepped structure.

BRIEF DESCRIPTION OF THE DRAWINGS

FIGS. 10 to 18 are process drawings showing the method of manufacturing the stepped structure of the nonvolatile semiconductor memory device of the first embodiment.

DETAILED DESCRIPTION

First Embodiment

Figure 1:
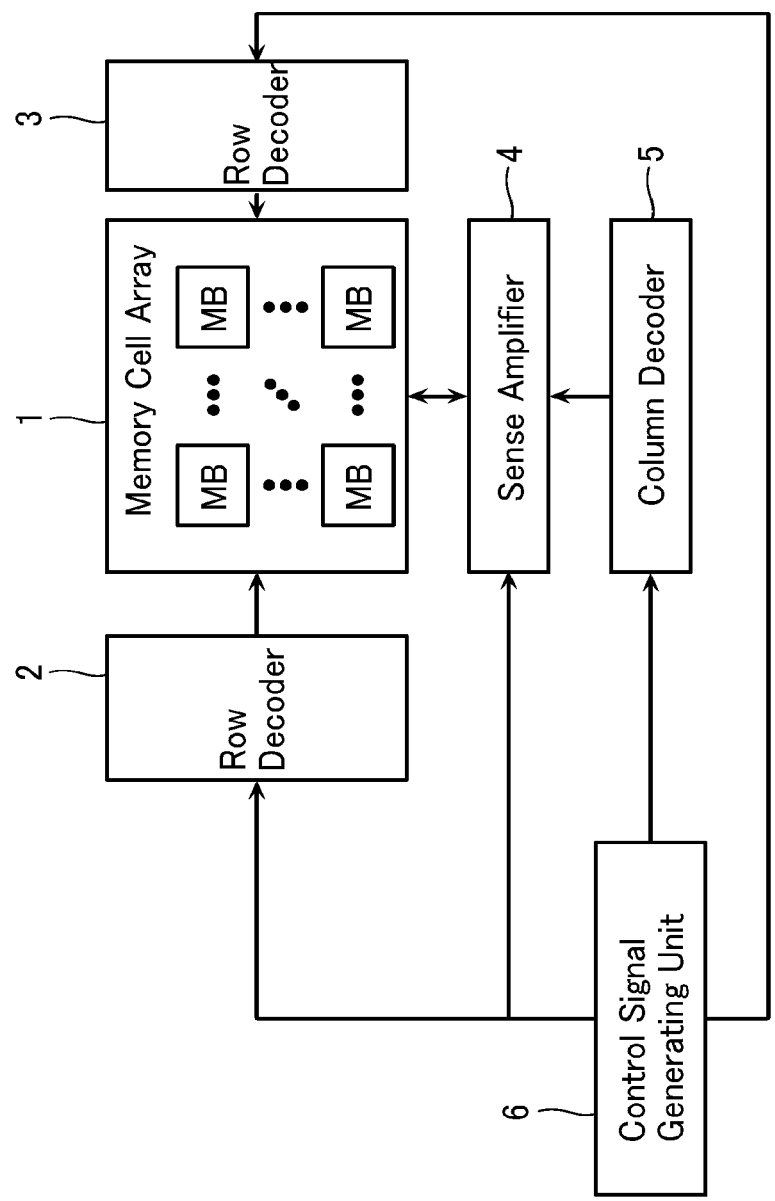
FIG. 1 is a functional block diagram showing a configuration of a nonvolatile semiconductor memory device according to a first embodiment.

A nonvolatile semiconductor memory device according to an embodiment described below comprises a memory cell region and a peripheral region. The memory cell region has a plurality of first layers and a plurality of second layers stacked alternately in a first direction on a semiconductor substrate therein, and has a memory cell disposed therein. The peripheral region is disposed in at least part of a periphery of the memory cell region, and includes a first stepped structure which has the plurality of first layers and the plurality of second layers stacked alternately in the first direction therein and which has an end of a lower first layer disposed further from the memory cell region than is an end of an upper first layer therein. A second stepped structure is disposed on the first stepped structure, has a plurality of third layers and a plurality of fourth layers stacked alternately in the first direction therein, and has an end of a lower third layer disposed further from the memory cell region than is an end of an upper third layer therein. A length in a second direction orthogonal to the first direction of the second stepped structure is shorter than a length in the second direction of the first layer or the second layer contacted by the second stepped structure. A length in a third direction orthogonal to the first direction and the second direction of the second stepped structure is shorter than a length in the third direction of the first layer or the second layer contacted by the second stepped structure.

Next, nonvolatile semiconductor memory devices according to embodiments will be described in detail with reference to the drawings. Note that these embodiments are merely examples. For example, the nonvolatile semiconductor memory devices described below have a structure in which a memory string extends linearly in a perpendicular direction to a substrate, but a similar structure may be applied also to a U-shaped structure in which the memory string is doubled back on an opposite side midway. In addition, each of the drawings of the nonvolatile semiconductor memory devices employed in the embodiments below is schematic, and thicknesses, widths, ratios, and so on, of layers are not necessarily identical to those of the actual nonvolatile semiconductor memory devices.

This is exemplified below. The present embodiment relates to a nonvolatile semiconductor memory device having a structure in which a plurality of MONOS (Metal-Oxide-Nitride-Oxide-Semiconductor) type memory cells (transistors) are provided in a height direction, each of the MONOS type memory cells including: a semiconductor film acting as a channel provided in a column shape perpendicularly to a substrate; and a gate electrode film provided on a side surface of the semiconductor film via a charge accumulation layer. However, a similar structure may be applied also to a charge accumulation layer of another form, for example, a SONOS (Semiconductor-Oxide-Nitride-Oxide-Semiconductor) type memory cell or a floating gate type memory cell.

First, an overall configuration of a semiconductor memory device according to an embodiment will be described.

FIG. 1 is a functional block diagram showing a configuration of a semiconductor memory device according to a first embodiment. The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or an erase operation, generates a control signal and controls the row decoders 2 and 3, the sense amplifier 4, and the column decoder 5.

Figure 2:
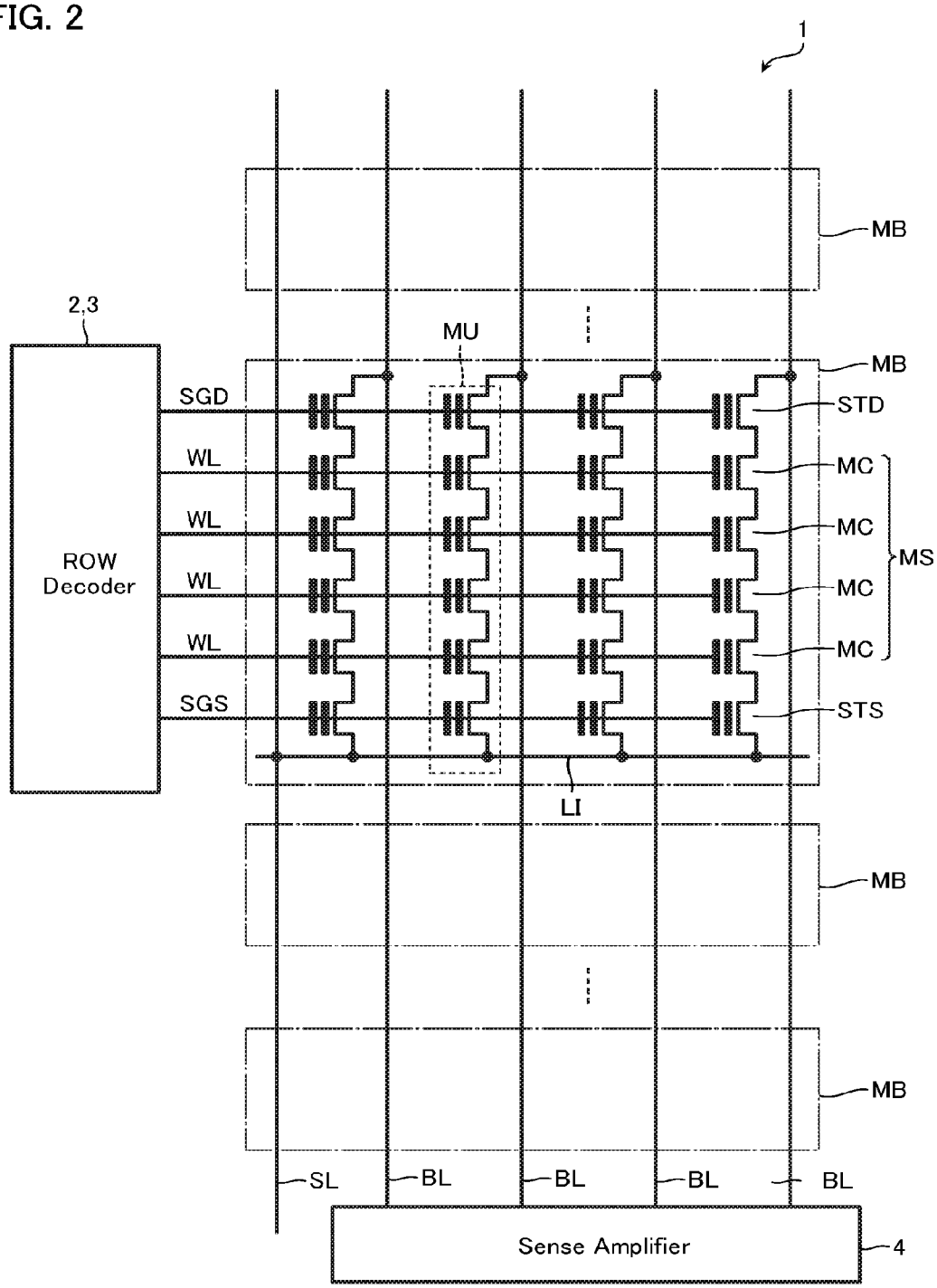
FIG. 2 is an equivalent circuit diagram showing a configuration of a memory cell array 1 of the same nonvolatile semiconductor memory device.

Next, a circuit configuration of part of the memory cell array 1 according to the present embodiment will be described with reference to FIG. 2. FIG. 2 is an equivalent circuit diagram showing a configuration of part of the memory cell array 1 according to the present embodiment.

As shown in FIG. 2, the memory cell array 1 according to the present embodiment comprises a plurality of the memory blocks MB. Moreover, commonly connected to these plurality of memory blocks MB are a plurality of bit lines BL and a source line SL. Each of the memory blocks MB is connected to the sense amplifier 4 via the bit lines BL, and is connected to an unillustrated source line driver via the source line SL.

The memory block MB comprises a plurality of memory units MU that have their one ends connected to the bit lines BL and have their other ends connected to the source line SL via a source contact LI.

As shown in FIG. 2, the memory unit MU comprises a plurality of the memory cells MC connected in series. As will be described later, the memory cell MC comprises a semiconductor layer, a charge accumulation layer, and a control gate, and accumulates a charge in the charge accumulation layer based on a voltage applied to the control gate, thereby changing a threshold value of the memory cell MC. Note that hereafter, the plurality of memory cells MC connected in series will be called a "memory string MS".

As shown in FIG. 2, commonly connected to the control gates of pluralities of the memory cells MC configuring different memory strings MS are, respectively, word lines WL. These pluralities of memory cells MC are connected to the row decoder 2 or the row decoder 3 via the word lines WL.

As shown in FIG. 2, the memory unit MU comprises a drain side select gate transistor STD connected between the memory string MS and the bit line BL. Connected to a control gate of the drain side select gate transistor STD is a drain side select gate line SGD. The drain side select gate line SGD is connected to the row decoder 2 or the row decoder 3, and selectively connects the memory string MS and the bit line BL based on an inputted signal.

As shown in FIG. 2, the memory unit MU comprises a source side select gate transistor STS connected between the memory string MS and the source contact LI. Connected to a control gate of the source side select gate transistor STS is a source side select gate line SGS. The source side select gate line SGS is connected to the row decoder 2 or the row decoder 3, and selectively connects the memory string MS and the source line SL based on an inputted signal.

Figure 3:
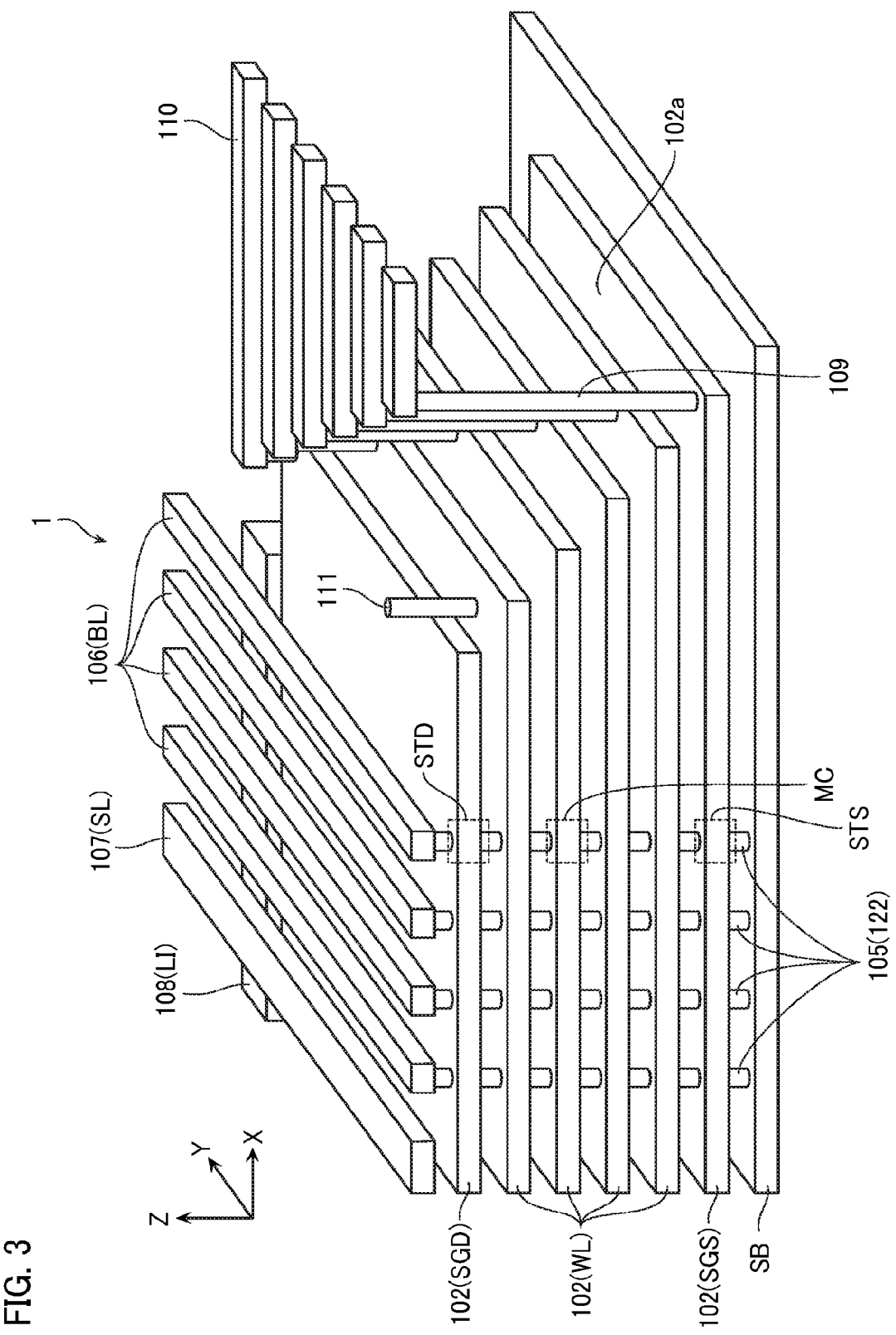
FIG. 3 is a perspective view showing the configuration of the memory cell array 1 of the same nonvolatile semiconductor memory device.

A schematic configuration of the memory cell array 1 according to the present embodiment will be described with reference to FIG. 3. FIG. 3 is a schematic perspective view showing a configuration of part of the memory cell array 1. Note that in FIG. 3, part of the configuration is omitted.

As shown in FIG. 3, the memory cell array 1 according to the present embodiment comprises: a substrate SB; and a plurality of conductive layers (first layers) 102 stacked in a Z direction on the substrate SB. Although not illustrated in FIG. 3, an inter-layer insulating layer (second layer) is interposed between the plurality of conductive layers 102. In addition, the memory cell array 1 includes a plurality of memory columnar bodies 105 extending in the Z direction. As shown in FIG. 3, an intersection of the conductive layer 102 and the memory columnar body 105 functions as the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, and the drain side select gate line SGD.

As shown in FIG. 3, the plurality of conductive layers 102 are formed in steps. The conductive layer 102 comprises a contact portion 102a that does not face a lower surface of the conductive layer 102 positioned in a layer above it. Moreover, the conductive layer 102 is connected to a via contact wiring line 109 at this contact portion 102a. Moreover, a wiring line 110 is provided at an upper end of the via contact wiring line 109. Note that the via contact wiring line 109 and the wiring line 110 are configured from a conductive layer of the likes of tungsten.

In addition, as shown in FIG. 3, the memory cell array 1 according to the present embodiment comprises a support 111. The support 111 communicates with holes provided in the plurality of conductive layers 102, and supports the contact portions 102a of the plurality of conductive layers 102.

Moreover, as shown in FIG. 3, the memory cell array 1 according to the present embodiment comprises a conductive layer 108. The conductive layer 108 faces side surfaces in a Y direction of the plurality of conductive layers 102, and extends in the X direction. A lower surface of the conductive layer 108 contacts the substrate SB. The conductive layer 108 includes a conductive layer of the likes of tungsten (W), for example, and functions as the source contact LI.

Moreover, as shown in FIG. 3, the memory cell array 1 according to the present embodiment comprises a plurality of conductive layers 106 and a conductive layer 107 that are positioned above the plurality of conductive layers 102 and the memory columnar body 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Besides the above-described tungsten (W), a material of the conductive layer 102 may also be formed by, for example, tungsten nitride (WN), tungsten silicide (WSix), tantalum (Ta), tantalum nitride (TaN), tantalum silicide (TaSix), palladium silicide (PaSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), or copper (Cu), or by a compound of these. However, the material of the conductive layer 102 may also be formed by polysilicon having an impurity added thereto.

Figure 4:
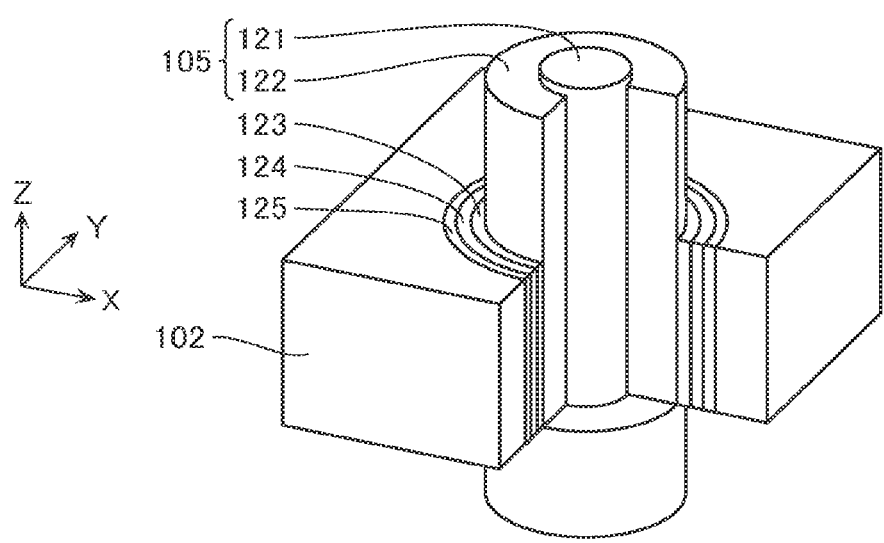
FIG. 4 is a perspective view showing a configuration of a memory cell MC of the same nonvolatile semiconductor memory device.

Next, a schematic configuration of the memory cell MC according to the present embodiment will be described with reference to FIG. 4. FIG. 4 is a schematic perspective view showing the configuration of the memory cell MC. Note that FIG. 4 shows the configuration of the memory cell MC, but the source side select gate transistor STS and the drain side select gate transistor STD may also be configured similarly to the memory cell MC. Moreover, in FIG. 4, part of the configuration is omitted.

As shown in FIG. 4, the memory cell MC is provided at an intersection of the conductive layer 102 and the memory columnar body 105. The memory columnar body 105 comprises: a core insulating layer 121; and a semiconductor layer 122 that covers a sidewall of the core insulating layer 121. Furthermore, provided between the semiconductor layer 122 and the conductive layer 102 are a tunnel insulating layer 123, a charge accumulation layer 124, and a block insulating layer 125.

The core insulating layer 121 is configured from an insulating layer of the likes of silicon oxide, for example. The semiconductor layer 122 is configured from a semiconductor layer of the likes of polysilicon, for example, and functions as a channel of the memory cell MC, the source side select gate transistor STS, and the drain side select gate transistor STD. The tunnel insulating layer 123 is configured from an insulating layer of the likes of silicon oxide, for example. The charge accumulation layer 124 is configured from an insulating layer of the likes of silicon nitride (SiN), for example, capable of accumulating a charge. The block insulating layer 125 is configured from an insulating layer of the likes of silicon oxide, for example.

Also employable as a material of the tunnel insulating layer 123 and the block insulating layer 125, besides a silicon oxide film, are, for example, $Al_2O_3$, $Y_2O_3$, $La_2O_3$ $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and so on.

Figure 5A:
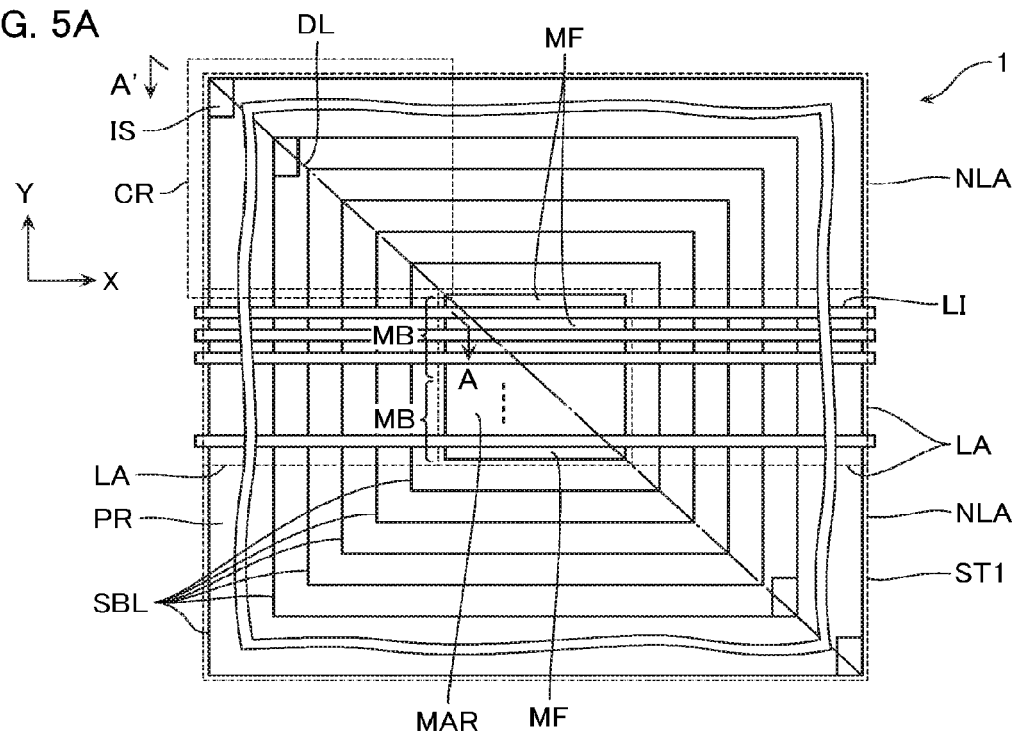
FIG. 5A is a plan view showing part of the nonvolatile semiconductor memory device of the first embodiment.
Figure 5B:
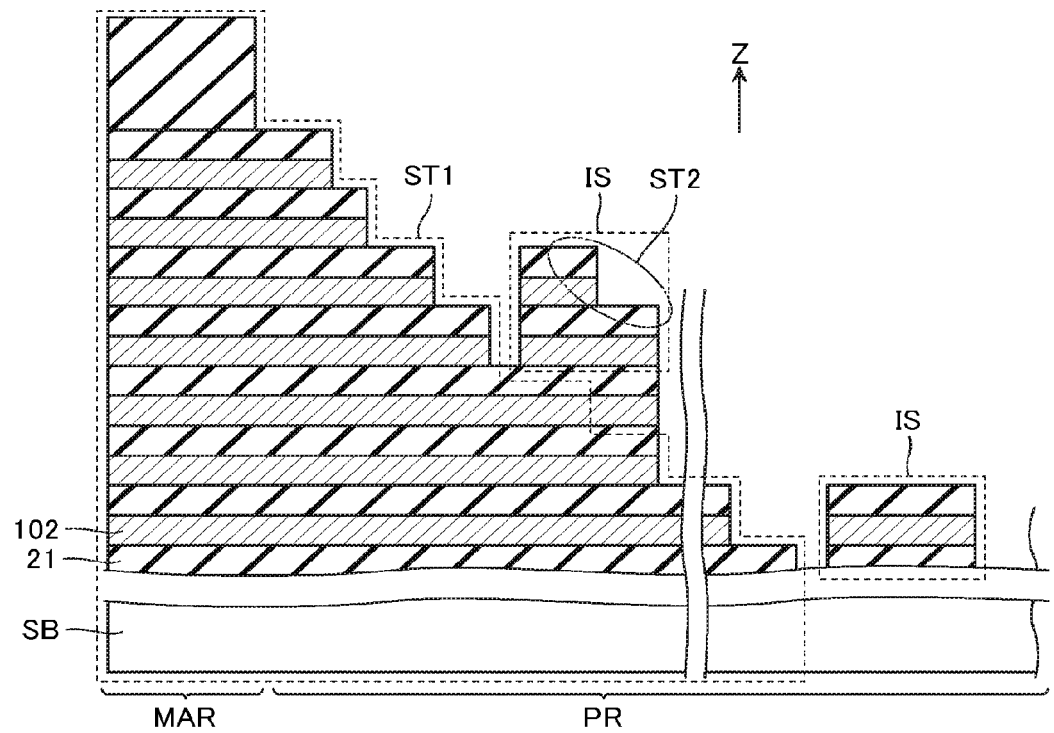
FIG. 5B is a cross-sectional view taken along the line A-A' of FIG. 5A.

Next, the memory cell array 1 will be described in more detail using FIGS. 5A and 5B. FIG. 5A is a schematic plan view of the memory cell array 1 according to the first embodiment; and FIG. 5B is a cross-sectional view taken along the line A-A' in FIG. 5A. Note that for ease of understanding, FIGS. 5A and 5B illustrate a structure of a peripheral region PR in a more simplified manner than in the actual device. Moreover, numbers of steps of stepped structures or positions and dimensions of island structures IS, and so on, are not necessarily matched in FIGS. 5A and 5B.

As shown in FIG. 5A, the memory cell array 1 includes a memory cell region MAR and the peripheral region PR.

The memory cell region MAR is a region where the memory cell array 1 is formed.

Note that sometimes a so-called dummy cell that, while having a similar configuration to a memory cell, is not employed as a region for storing data of a user during an operation, and a dummy source contact LI', are disposed. A region where these are disposed is not necessarily included in the memory cell region MAR.

The peripheral region PR includes a wiring line region LA (first region) and a non-wiring line region NLA (second region). The peripheral region PR includes a first stepped structure ST1 (region indicated by a dashed line) that surrounds the memory cell region MAR.

The wiring line region LA is a region in a direction of extension of the source contact LI (X direction), with respect to the memory cell region MAR. In other words, the wiring line region LA is a region overlapping a portion of the memory cell region MAR extended in the X direction, of the peripheral region PR. Disposed in the wiring line region LA is the via contact wiring line 109 (not illustrated) to the conductive layer 102 disposed in the memory cell region MAR.

The non-wiring line region NLA is a region other than the above-described wiring line region LA, of the peripheral region PR. In other words, the non-wiring line region NLA is, for example, a portion not overlapping the portion of the memory cell region MAR extended in the X direction, of the peripheral region PR.

Note that in a case in which the source contact LI extends in a Y direction or in a case in which the source contact LI extends in the XY directions, the wiring line region LA is a portion overlapping a portion of the memory cell region MAR extended in the Y direction or the XY directions, of the peripheral region PR. Moreover, the non-wiring line region NLA is a portion not overlapping the portion of the memory cell region MAR extended in the Y direction or the XY directions, of the peripheral region PR.

Next, the source contact LI will be described. The memory cell array 1 includes a plurality of the memory blocks MB. The memory block MB further includes a plurality of memory fingers MF. These plurality of memory fingers MF have an insulating isolation trench formed between them, and this insulating isolation trench is disposed so as to isolate the conductive layer 102 and an inter-layer insulating layer 21 that configure the memory finger MF and the memory block MB. The source contact LI has this insulating isolation trench implanted with an insulating isolation film S (not illustrated).

Note that the conductive layers 102 of the memory fingers MF in an identical memory block MB need not necessarily be isolated by the insulating isolation trench. For example, the conductive layers 102 corresponding to the drain side select gate lines SGD among an identical memory block MB may be divided, and the conductive layers 102 corresponding to the other word lines WL and source side select gate lines SGS among the identical memory block MB may be undivided.

Note that in the description hereafter, the conductive layer 102 and the inter-layer insulating layer 21 will be treated as one body in the memory cell array 1, even if they are divided by the source contact LI or the insulating isolation trench.

Next, a cross-sectional structure will be described in accordance with FIG. 5B.

The peripheral region PR includes the first stepped structure ST1 and an island structure IS (protruding portion). The island structure IS is disposed on a region of part of the first stepped structure ST1, and includes a second stepped structure ST2.

The first stepped structure ST1 has a structure in which a plurality of the conductive layers 102 and the inter-layer insulating layers 21 are alternately stacked. These conductive layers 102 and inter-layer insulating layers 21 have an end of a downwardly positioned layer located further from the memory cell region MAR than is an end of an upwardly positioned layer. Due to this configuration, in the first stepped structure ST1, the lower a layer in which a conductive layer 102 is positioned, the further from the memory cell region MAR is a position at which its contact portion 102a (not illustrated in FIG. 5B, refer to FIG. 3) is provided, and the higher a layer in which a conductive layer 102 is positioned, the closer to the memory cell region MAR is a position at which its contact portion 102a (not illustrated in FIG. 5B, refer to FIG. 3) is provided.

The island structure IS is a structure in which a proximity of a tip of at least step protrudes in a direction in which the plurality of conductive layers (third layers) 102 and inter-layer insulating layers (fourth layers) 21 are alternately stacked (Z direction). To specify the island structure IS in the present embodiment, the island structure IS is surrounded by a dashed line in FIG. 5B. This specification by a dashed line will be omitted in the drawings hereafter.

Note that the conductive layer 102 and the inter-layer insulating layer 21 in the island structure IS are formed using the same materials as, and in an identical step to the conductive layer 102 and the inter-layer insulating layer 21 in the first stepped structure ST1. Therefore, a certain conductive layer 102 in the island structure IS is configured from an identical material to, and is at an equal distance in the Z direction from the substrate SB to the corresponding conductive layer 102 in the first stepped structure ST1.

Moreover, as shown in FIG. 5B, at least some of the island structures IS of the present embodiment have a stepped structure (second stepped structure ST2: indicated by a two dot-dashed line in FIG. 5B) of which step height becomes higher as the island structure IS itself approaches the memory cell region MAR (two steps in FIG. 5B). This second stepped structure ST2 is a step difference formed in an upper surface of the island structure IS.

FIG. 5A shows a step boundary SBL where a step height of the first stepped structure ST1 of the peripheral region PR changes. In other words, in FIG. 5A, a region surrounded by the SBL is of an identical height, and that height increases as the memory cell region MAR is approached (as the substrate center is approached).

As shown in FIG. 5A, the island structure IS in the present embodiment is disposed in the non-wiring line region NLA of the first stepped structure ST1.

The island structure IS is disposed close to a corner portion CR of each of steps configuring the first stepped structure ST1. Now, the corner portion CR refers to a proximity of the four corners of the first stepped structure ST1 of the peripheral region PR. In other words, the corner portion CR is a region including a portion where the portion of the memory cell region MAR extended in the XY directions and the peripheral region PR do not overlap.

Furthermore, the island structures IS are disposed linearly so as to closely follow a diagonal line DL of the substrate SB, in the peripheral region PR surrounding the memory cell region MAR.

Note that a length in the X direction of the island structure IS is shorter than a length in the X direction of the inter-layer insulating layer 21 or conductive layer 102 that that island structure IS contacts by its lower surface. Moreover, the length in the X direction of the island structure IS is shorter than the length in the X direction of the inter-layer insulating layer 21 or conductive layer 102 that the island structure IS contacts by its lower surface. Note that in the present embodiment, the X direction is a shorter direction of the island structure, and the Y direction is a longer direction of the island structure.

The conductive layer 102 (third layer) in the island structure IS is electrically insulated from the conductive layer 102 in the first stepped structure by an unillustrated inter-layer insulating film (in other words, the conductive layer 102 in the island structure IS is placed in a floating state electrically).

Due to the present embodiment, the memory cell array 1 comprises the island structure IS. The memory cell array 1 comprising the island structure IS makes it possible for a position of the step boundary SBL (boundary where the step height of the first stepped structure ST1 changes) to be formed accurately in a later-to-be-described method of manufacturing.

Moreover, due to the present embodiment, the island structure IS is disposed in the non-wiring line region NLA. The island structure IS being disposed in the non-wiring line region NLA makes it possible for the island structure IS to be disposed without being an obstruction in a case in which the wiring line 110 or the via contact wiring line 109 is disposed.

[Method of Manufacturing Stepped Structure]

Next, a method of manufacturing the above-mentioned stepped structure will be described using FIGS. 6 to 18.

Figure 6:
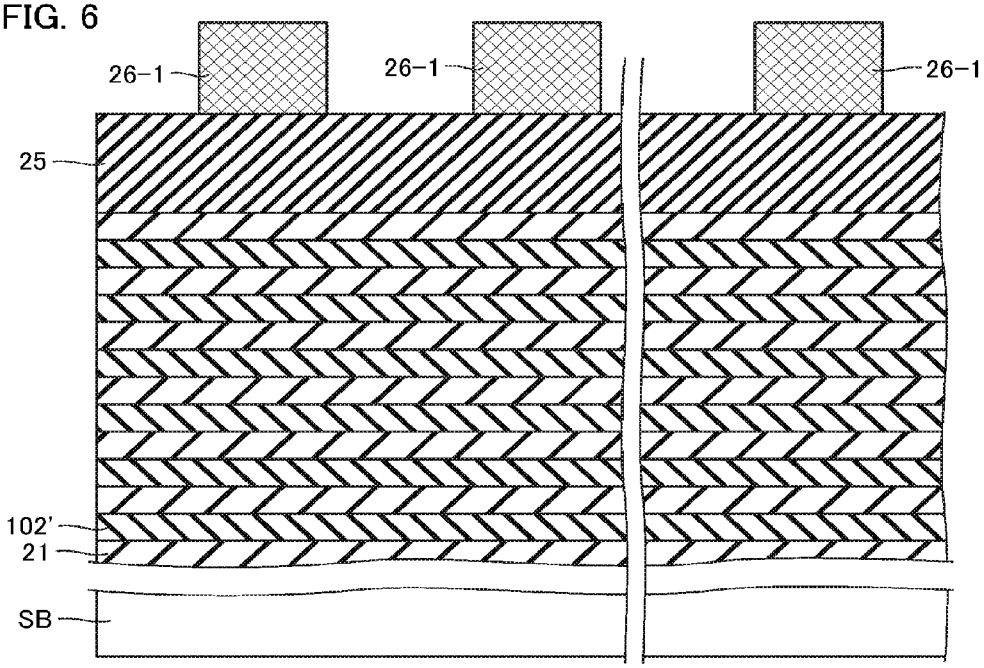
FIGS. 6 to 8 are process drawings showing a method of manufacturing a stepped structure of the nonvolatile semiconductor memory device of the first embodiment.

As shown in FIG. 6, a stacked body having stacked therein a plurality of sacrifice films 102' configured from, for example, a silicon nitride film and the plurality of inter-layer insulating layers 21 configured from, for example, a silicon oxide film, is formed on the substrate SB configured from the likes of silicon. Then, a hard mask 25 configured from, for example, silicon nitride or silicon oxide is formed on an upper portion of the stacked body. Then, after a resist 26-1 has been applied, patterning into a desired island structure is performed by a lithography method. Note that in the present embodiment, the hard mask 25 is described as being a silicon nitride film.

Figure 7:
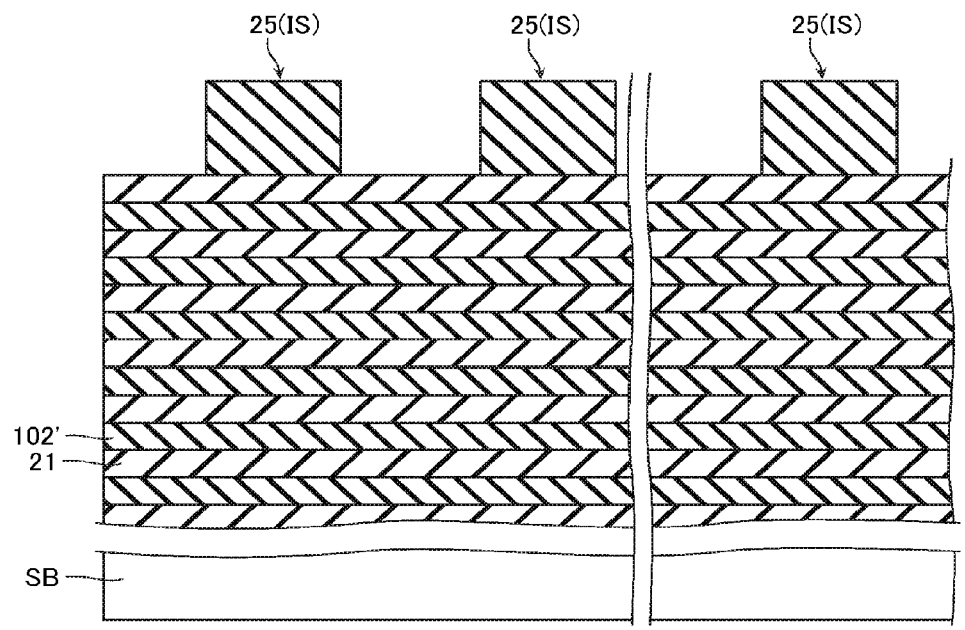

As shown in FIG. 7, the hard mask 25 is etched, using the resist 26-1 as a mask material, by etching by the likes of a RIE (Reactive Ion Etching) method. The island structure IS is formed based on a pattern (width, depth, height) of this remaining hard mask 25.

Figure 8:
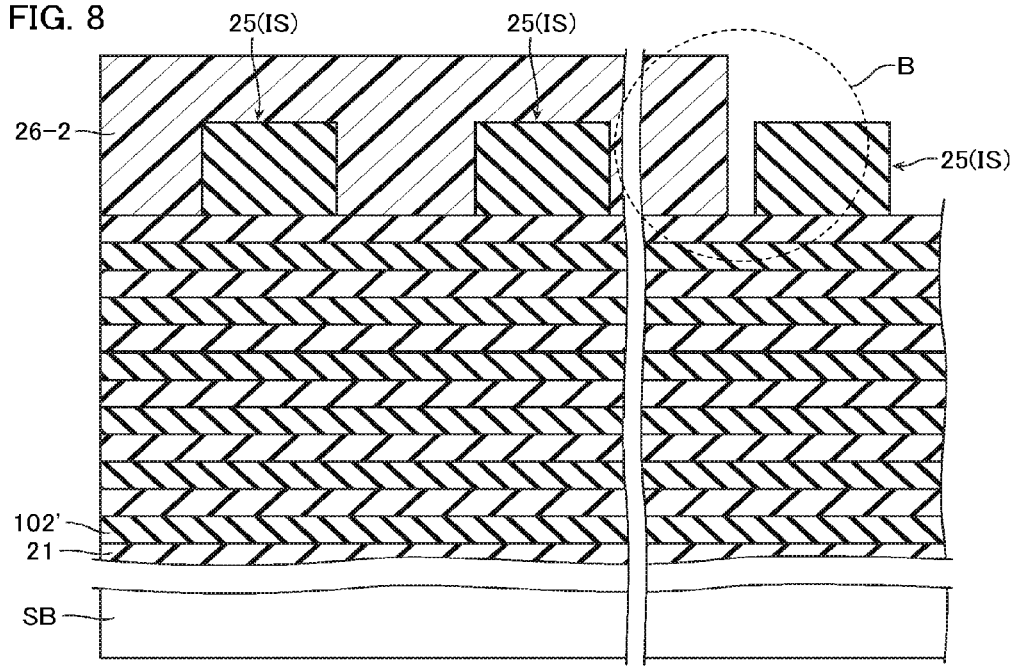

As shown in FIG. 8, a resist 26-2 is formed by a lithography method. The resist 26-2 is formed inward of the island structure IS disposed most to an end side (the island structure IS furthest from the memory cell region MAR).

In order to confirm that a position of a boundary of the resist 26-2 is disposed in a desired position, measurement of a distance between the exposed island structure IS and the boundary of the resist 26-2 (end surface of the resist 26-2) is performed. If the position of the boundary of the resist 26-2 is out of alignment with an appropriate position, the resist 26-2 is detached by wet etching or ashing, and the resist 26-2 due to a lithography method is formed again by patterning.

Note that during re-patterning, in order to compensate for a shift portion (dimension misalignment) from the appropriate position, adjustment of an exposure amount or adjustment of an exposure position is performed.

As a result, adjustment of a portion that the position of the boundary of the resist 26-2 is out of alignment from a desired position by a first lithography is made possible, and it is made possible to accurately control a position and dimension of the stepped structure.

Now, a method of resist position confirmation will be described in detail using FIG. 9.

Figure 9:
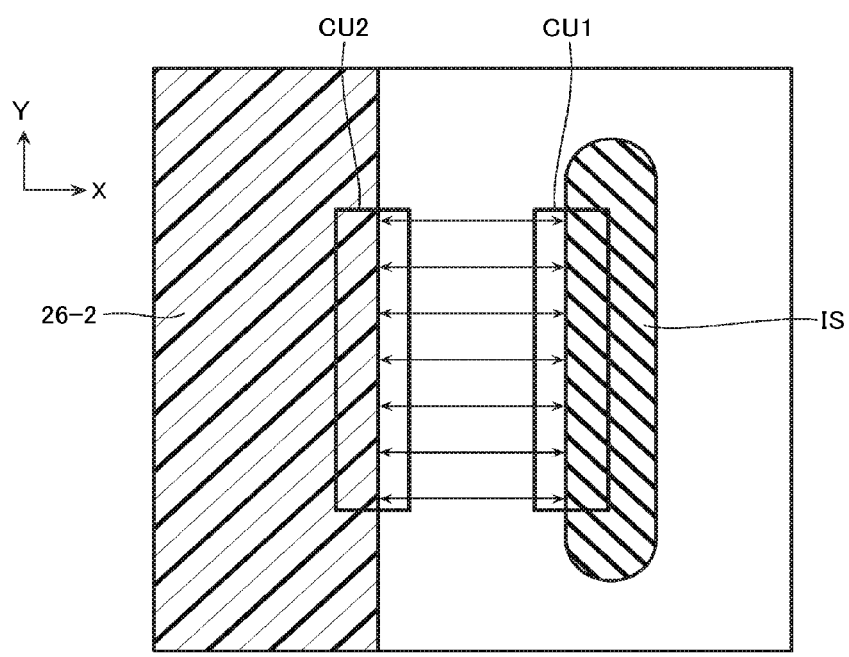
FIG. 9 is a view showing a state where a portion including a resist and a protruding portion is observed, in the nonvolatile semiconductor memory device according to the embodiment.

FIG. 9 is a schematic view (plan view in the XY directions) for explaining measurement of a distance between the island structure IS and an end of the resist 26-2 if determining a position of the resist 26-2 with reference to the island structure IS. In a case in which a range including B of FIG. 8 is observed by a device capable of measuring a distance in units of several microns (such as a CD-SEM), the island structure IS and the resist 26-2 can be observed in one screen, as shown in FIG. 9. Then, cursors CU1 and CU2 are appropriately moved to ends of the island structure IS and the resist 26-2. As a result, edges of the island structure IS and the resist 26-2 are respectively detected within the cursor CU1 and the cursor CU2, and a distance between those edges is calculated by the CD-SEM (specifically, as shown in FIG. 9, a plurality of distances in a horizontal direction between the detected edges are calculated, and their average value is calculated). As described above, the distance between the ends of the island structure IS and the resist 26-2 is measured. At this time, measurement magnification is approximately 30,000 times or more, and the distance between the two can be measured in a unit of 1 nm.

On the other hand, in the case of assuming there is no island structure IS like that of the present embodiment, there is no object capable of acting as a measurement reference like the island structure IS close to the end of the resist 26-2, hence measurement magnification thereof ends up being 10,000 times or less.

The present embodiment makes it possible to highly accurately measure and control a boundary position of the resist 26-2 due to a lithography method. Furthermore, the present embodiment makes it possible to perform compensation of an exposure amount during re-lithography in a case in which a deviation from the appropriate position has become clear.

Note that in order to achieve high measurement accuracy, measurement magnification must be raised. Therefore, a dimension of the island structure IS is preferably 5 μm or more in its longer direction, in other words, the Y direction.

Moreover, in the present embodiment, as shown in FIG. 5A, the island structure IS is formed on both sides so as to sandwich the memory cell region MAR of the peripheral region PR.

During lithography, so-called misalignment sometimes occurs between a mask and a wafer. Therefore, a measurement dimension of the resist 26-2 made with reference to the island structure IS includes a misalignment component of lithography.

In order to remove this misalignment component, resist boundary measurement is performed using both of the island structures IS formed on both sides sandwiching the memory cell region MAR, and the two measurement values are averaged. Averaging the two measurement values enables calculation of an appropriate exposure amount regardless of effects of misalignment.

If performing the above-described measurement, the island structures IS formed on both sides sandwiching the memory cell region MAR are disposed in symmetrical positions sandwiching the memory cell region MAR, whereby measurement accuracy can be further improved. In FIG. 5A, the island structures IS are disposed in positions of point symmetry to the memory cell region MAR, but the present embodiment is not limited to this configuration, and it is of course also possible for the island structures IS to be disposed in positions of line symmetry to the memory cell region MAR.

Figure 10:
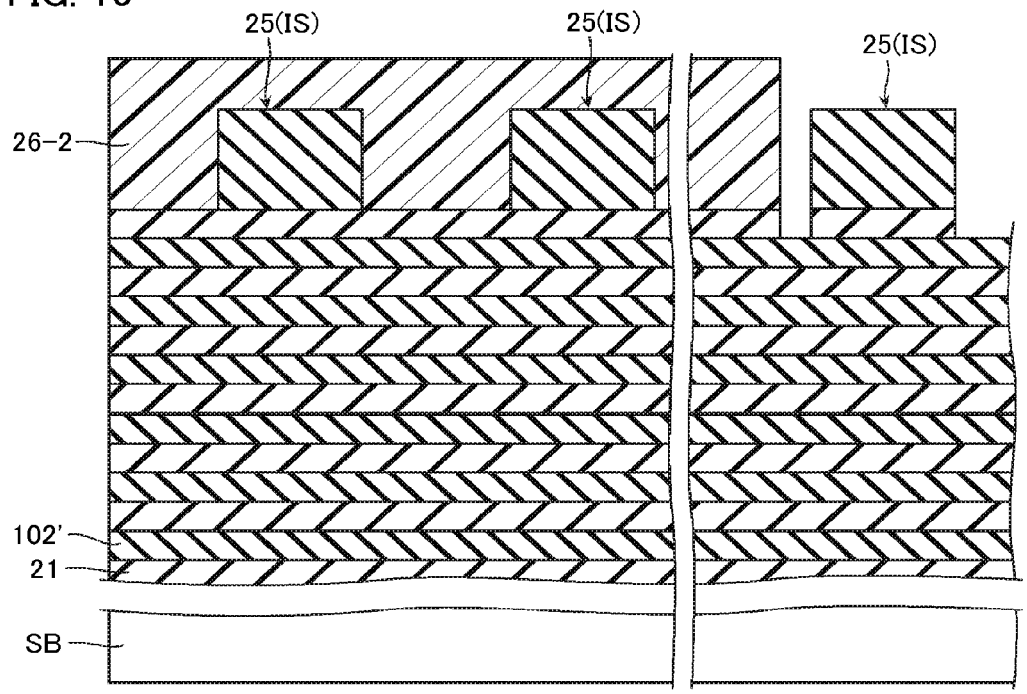

As shown in FIG. 10, the inter-layer insulating layer 21 configured from silicon oxide undergoes etching processing by, for example, RIE. Desirable as an etching condition of the RIE is a condition of having a sufficient selection ratio with respect to silicon nitride (a condition that an etching rate of silicon oxide is sufficiently faster than an etching rate of silicon nitride).

Figure 11:
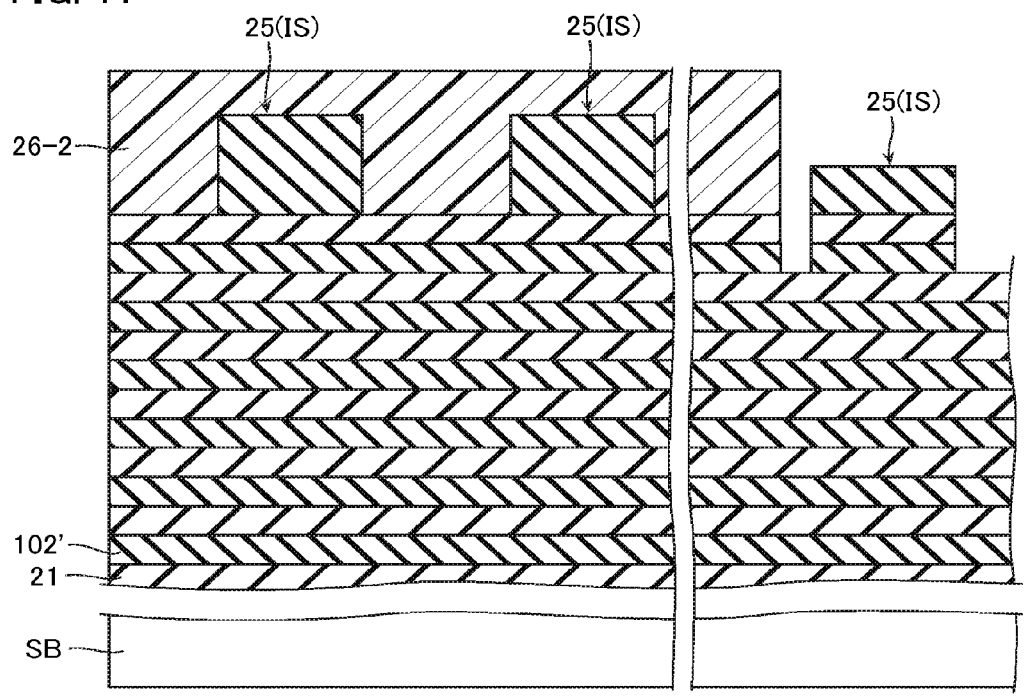

As shown in FIG. 11, the sacrifice film 102' configured from silicon nitride undergoes etching processing by, for example, RIE. Desirable as an etching condition of the RIE is a condition of having a sufficient selection ratio with respect to silicon oxide.

In this way, a first step difference of the stepped structure is formed.

Figure 12:
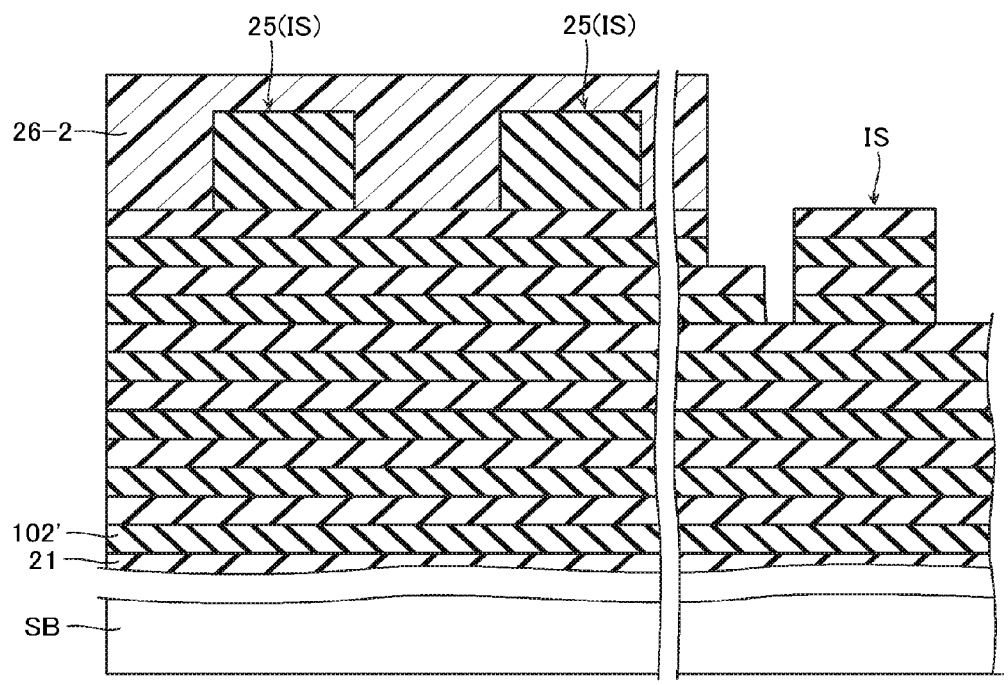

As shown in FIG. 12, slimming (etching back) of the resist 26-2 is performed to form a second step portion of the stepped structure. That is, an end surface of the resist 26-2 is pushed back by isotropic etching. Then, similarly to as described using FIGS. 10 and 11, silicon oxide undergoes etching processing and silicon nitride undergoes etching processing.

The silicon nitride/SiO processing and the slimming of the resist 26-2 described using the above FIGS. 10 to 12 are repeated a desired number of times, whereby step difference formation of the stepped structure is performed.

Note that position measurement of the resist described using FIGS. 8 and 9 may also be performed after the above-described slimming of the resist 26-2. This makes it possible for dimensions of each of step differences of the stepped structure of the peripheral region PR to be more accurately controlled.

Figure 13:
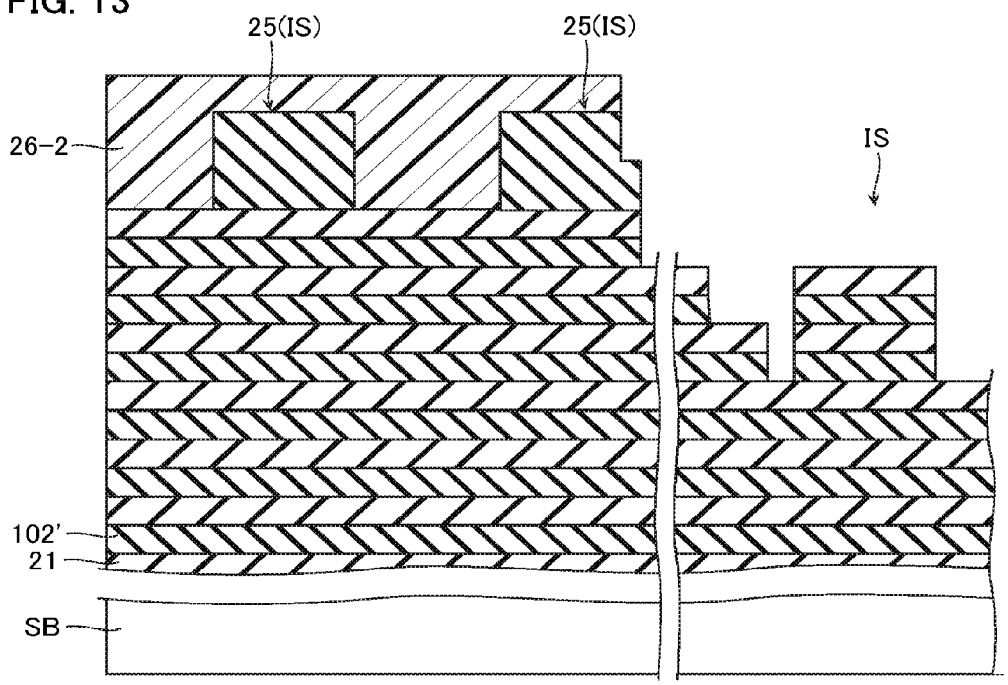

The above-described lithography and slimming of the resist 26-2 are performed and steps of removing the inter-layer insulating layer 21 and the sacrifice film 102' one layer at a time are repeated similarly to the steps described by FIGS. 10 and 11 to obtain a configuration shown in FIG. 13. In this state, the end of the resist 26-2 reaches the island structure IS positioned next at a leading edge, and a step difference occurs in an upper surface of that island structure IS.

Figure 14:
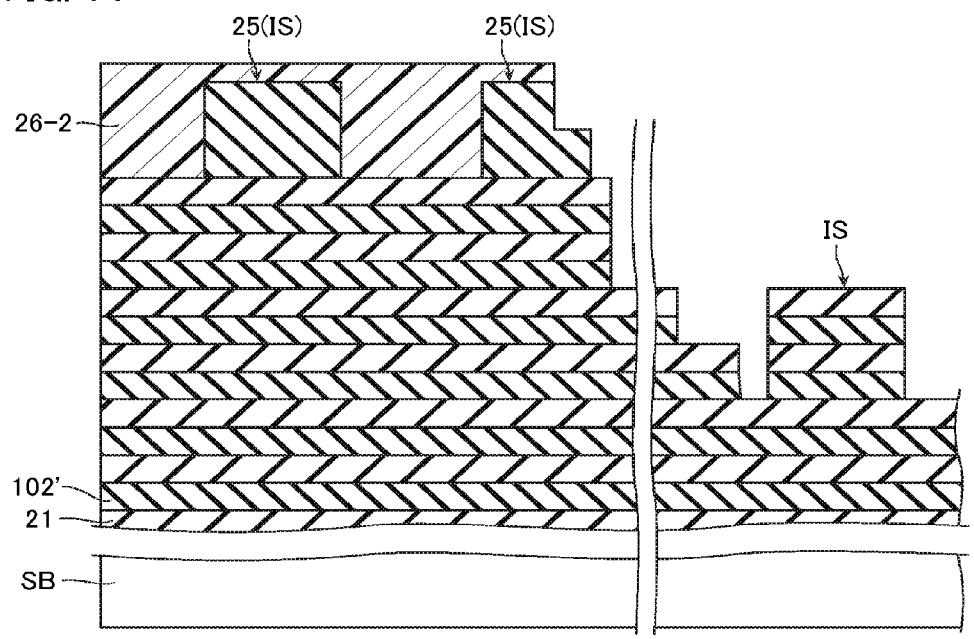

Then, steps of performing lithography and slimming of the resist 26-2 and the steps of removing the inter-layer insulating layer 21 and the sacrifice film 102' one layer at a time are repeated similarly to the steps described by FIG. 13 to obtain a configuration shown in FIG. 14.

Figure 15:
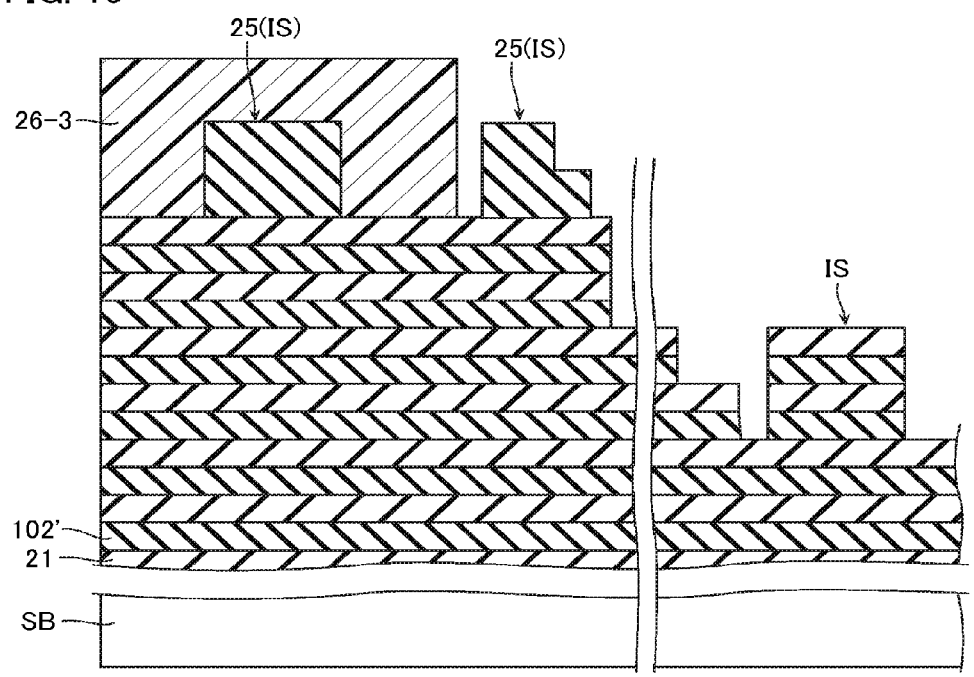

Subsequently, the resist 26-2 is all removed. Then, as shown in FIG. 15, a new resist 26-3 is formed by a lithography method so as to enable a resist boundary to be disposed at a desired position from the island structure IS positioned next at a leading edge (the island structure IS next furthest from the memory cell region MAR).

Then, measurement of a distance between the exposed island structure IS and the boundary of the resist 26-3 is performed similarly to in steps described using FIGS. 8 and 9. If the position of the boundary of the resist 26-3 is out of alignment with an appropriate position, the resist 26-3 is detached by wet etching or ashing. Then, the resist 26-3 is formed by a lithography method.

As shown in FIG. 16, the inter-layer insulating layer 21 and the sacrifice film 102' undergo etching processing one layer at a time, similarly to in steps described by FIGS. 10 and 11.

Figure 18:
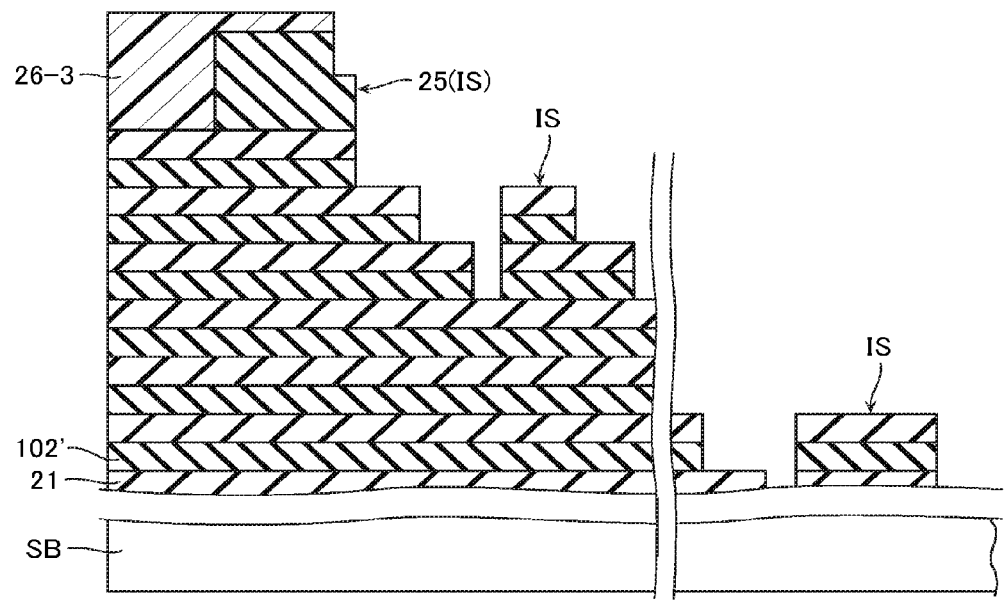

As shown in FIGS. 17 and 18, the above-described resist slimming and etching processing of the inter-layer insulating layer 21 and sacrifice film 102' are repeatedly performed.

The above steps are repeated a certain number of times, and then formation of an insulating film, planarization, wiring line formation, memory cell formation, and so on, are performed and the sacrifice film 102' is replaced by a metal such as tungsten to configure the conductive layer 102, whereby the configuration of FIG. 5B is obtained.

(Advantages)

In the above embodiment, the position of a resist formed by a lithography method is measured with reference to an island structure IS. In other words, the distance between the resist and the island structure IS immediately outward of the resist is measured. Moreover, if a deviation from a certain position occurs in the position of the resist, an exposure amount and an exposure position are compensated, and then the resist is reformed.

By measuring in this way, the position of a step boundary of a stepped structure is formed at a desired position with higher accuracy. By forming the step boundary accurately, a positional relationship of the via contact wiring line 109 formed in the wiring line region LA and the first stepped structure ST1 is accurately formed. By forming the first stepped structure ST1 accurately, a malfunction such as short-circuiting between the via contact wiring line 109 and an unintended conductive layer 102 (a conductive layer other than the conductive layer 102 to which the via contact wiring line 109 is electrically connected by its lower portion) can be suppressed.

Furthermore, since short-circuiting between the via contact wiring line 109 and an unintended conductive layer 102 can be suppressed, the present embodiment makes it possible to narrow a width per one step of the first stepped structure. That is, miniaturization of the nonvolatile semiconductor memory device is made possible. Moreover, since miniaturization is possible, a low-priced nonvolatile semiconductor memory device can be obtained.

Second Embodiment

Next, a nonvolatile semiconductor memory device according to a second embodiment will be described with reference to FIGS. 19 to 27. The nonvolatile semiconductor memory device according to the second embodiment has a substantially identical overall configuration to that of the nonvolatile semiconductor memory device according to the first embodiment. However, the nonvolatile semiconductor memory device according to the second embodiment has a configuration of the island structure IS which differs from that of the first embodiment.

Figure 19:
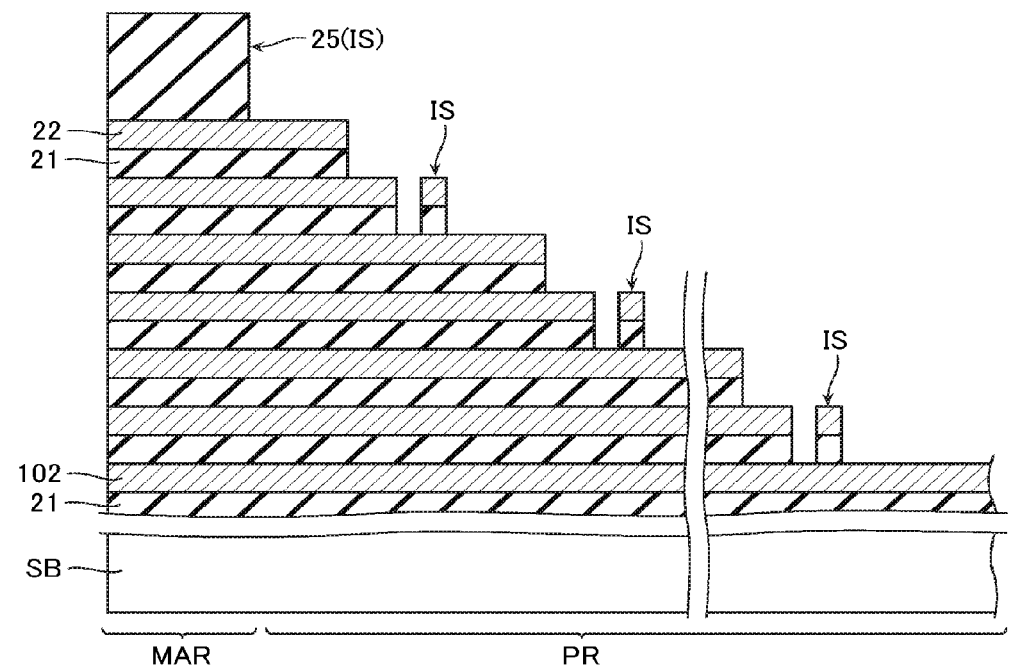
FIG. 19 is a cross-sectional view showing part of a nonvolatile semiconductor memory device of a second embodiment.

FIG. 19 is a partial cross-sectional view including the peripheral region configured from the stepped structure, of the nonvolatile semiconductor memory device according to the second embodiment.

In the second embodiment, similarly to in the first embodiment, the stepped structure of the peripheral region PR includes the island structure IS (protruding portion) in which a proximity of a tip of at least one step protrudes in a direction (Z direction) in which the plurality of conductive layers (third layers) 102 and inter-layer insulating layers (fourth layers) 21 are alternately stacked.

Moreover, although in the first embodiment, the island structure IS had a two-step stepped structure, in the second embodiment, the island structure IS does not have a stepped structure and is configured from a two-layer structure of the conductive layer 102 and the inter-layer insulating layer 21.

Next, a method of manufacturing the nonvolatile semiconductor memory device according to the second embodiment will be described using FIGS. 20 to 27.

Figure 20:
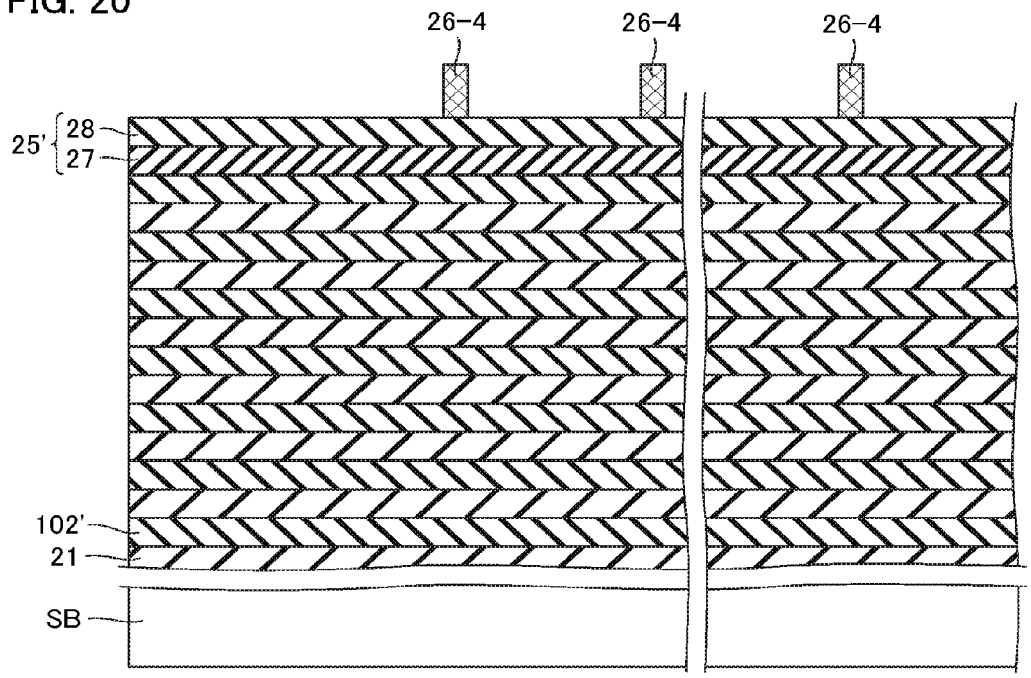
FIGS. 20 to 27 are process drawings showing a method of manufacturing a stepped structure of the nonvolatile semiconductor memory device of the second embodiment.

As shown in FIG. 20, a mask layer 25' having mask materials 27 and 28 stacked therein is applied to an upper portion of a stacked body of inter-layer insulating layers 21 and sacrifice films 102'. Usable as materials of the mask materials 27 and 28 are materials having characteristics regarding etching that are similar to those of, respectively, the inter-layer insulating layer 21 and the sacrifice film 102'. For example, silicon oxide is usable as the mask material 27, and silicon nitride is usable as the mask material 28. After formation of this mask layer 25', a resist 26-4 is disposed at a position for disposing the island structure, of an upper portion of the mask layer 25'.

Figure 21:
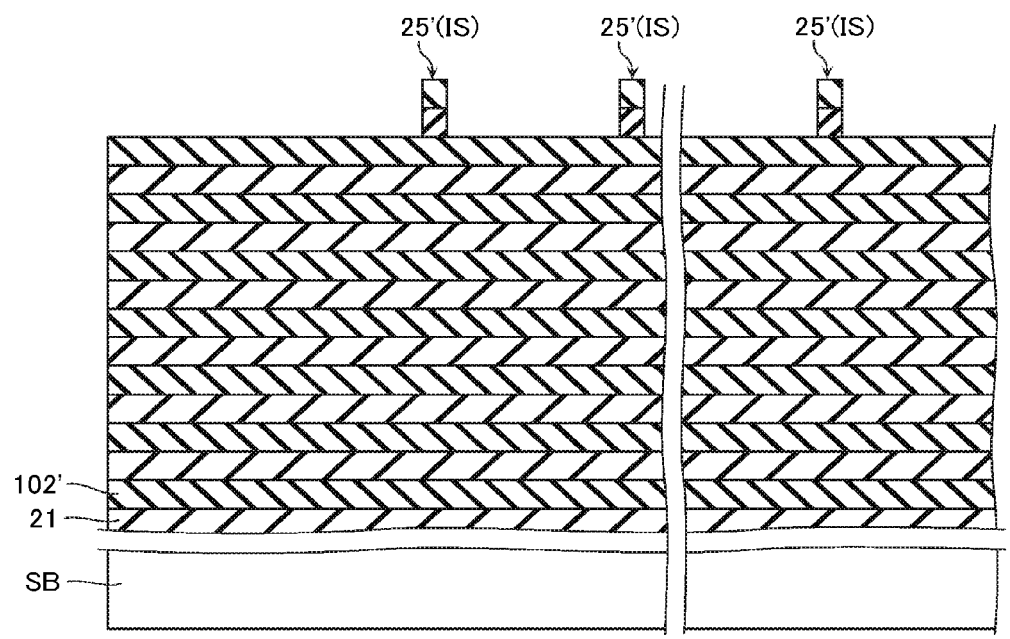

Moreover, as shown in FIG. 21, etching is performed twice to configure the mask layer 25' as the island structure IS as shown in FIG. 21. In this second embodiment, this mask layer 25' functions as a scale during stepped structure formation.

Figure 22:
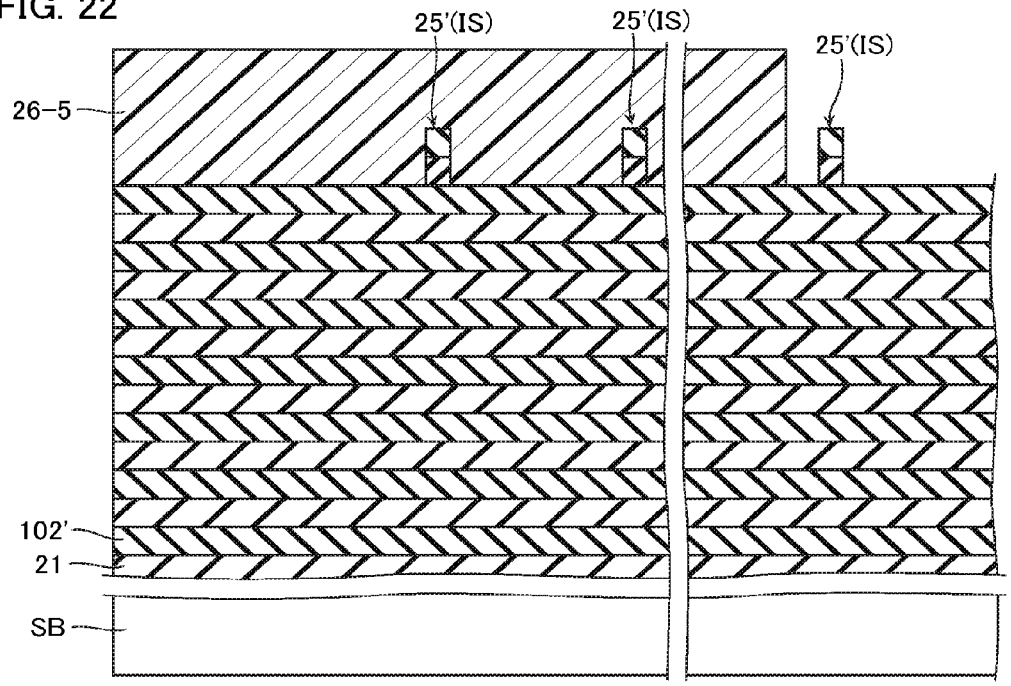

As shown in FIG. 22, patterning of a resist 26-5 is implemented by lithography, so as to enable a resist boundary to be disposed at a desired position from the island structure IS positioned most to an end, that is, the island structure IS furthest from the memory cell region MAR.

In order to confirm that a position of a boundary of the resist 26-5 is disposed in a desired position, measurement of a distance between the exposed island structure IS and the boundary of the resist 26-5 is performed by a similar method to in the first embodiment (refer to FIG. 9). If the position of the boundary of the resist 26-5 is out of alignment with an appropriate position, the resist 26-5 is detached by wet etching or ashing. After detachment, the resist 26-5 is formed by a lithography method.

Adjustment of exposure amount or exposure position is possible during re-exposure, similarly to in the first embodiment.

As a result, adjustment of a portion that the position of the boundary of the resist 26-5 is out of alignment from a desired position by a first lithography is made possible.

Figure 23:
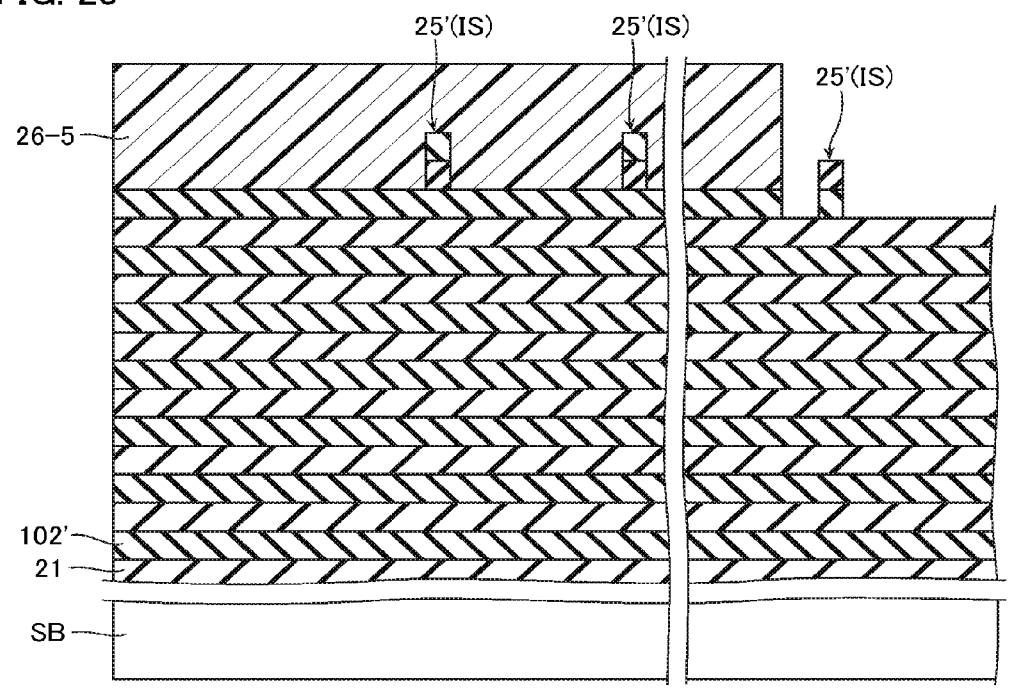

As shown in FIG. 23, the inter-layer insulating layer 21 configured from silicon oxide undergoes etching processing by, for example, RIE.

Figure 24:
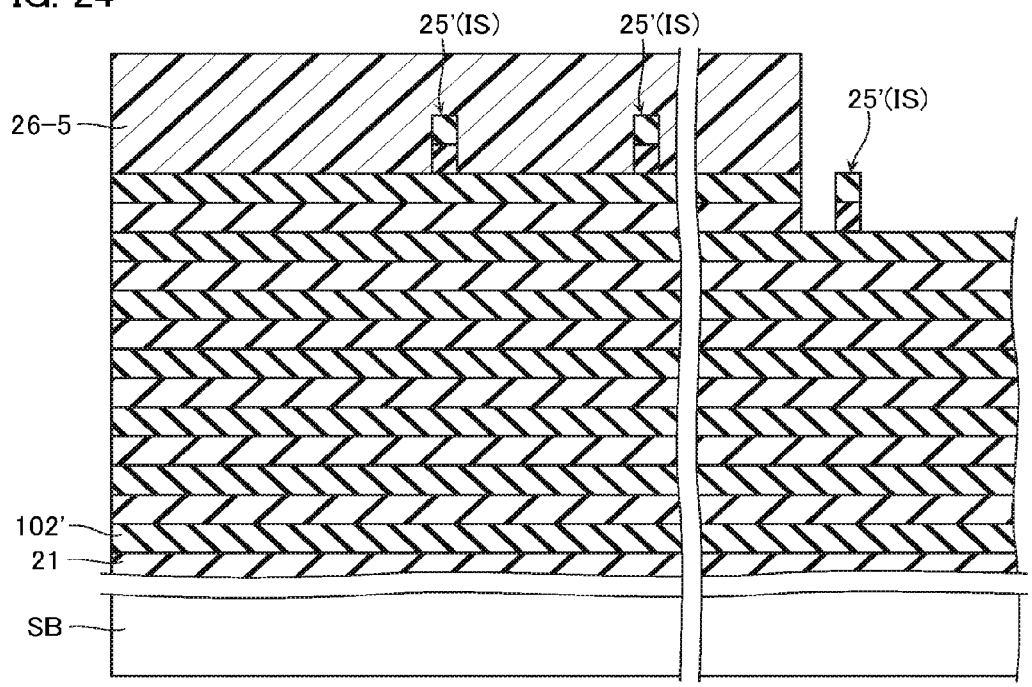

As shown in FIG. 24, the sacrifice film 102' configured from silicon nitride undergoes etching processing by, for example, RIE.

In this way, a first step difference is formed. The island structure IS of this second embodiment is positioned at a leading edge of the formed step, and, contrary to in the first embodiment, does not include a stepped structure on its upper surface.

Figure 25:
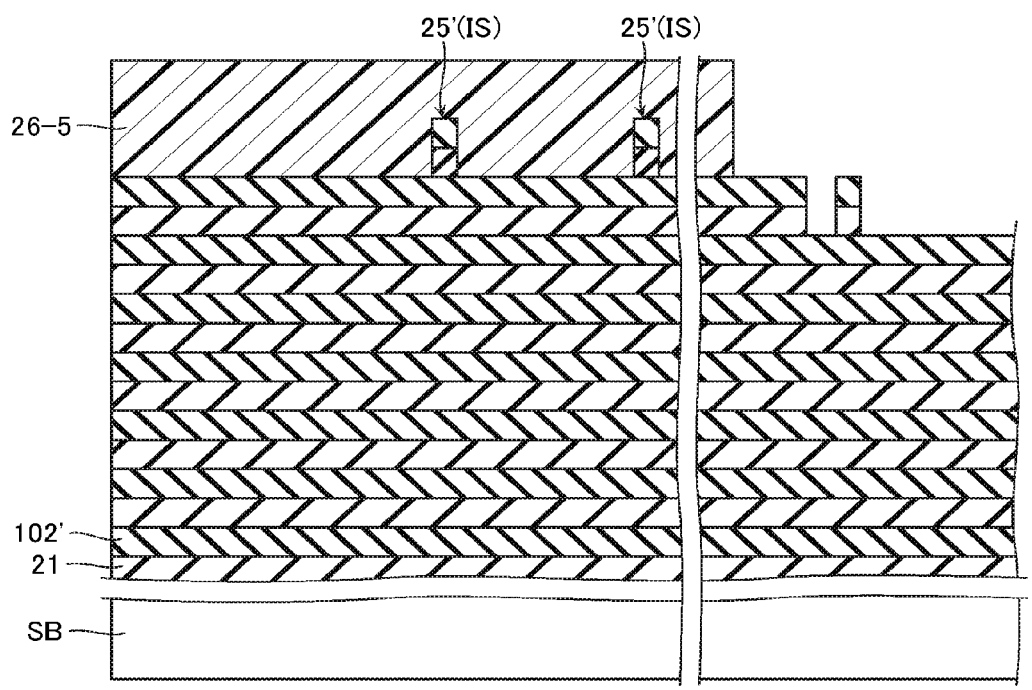

As shown in FIG. 25, the resist is slimmed (etched back) by an amount of a certain length.

Figure 26:
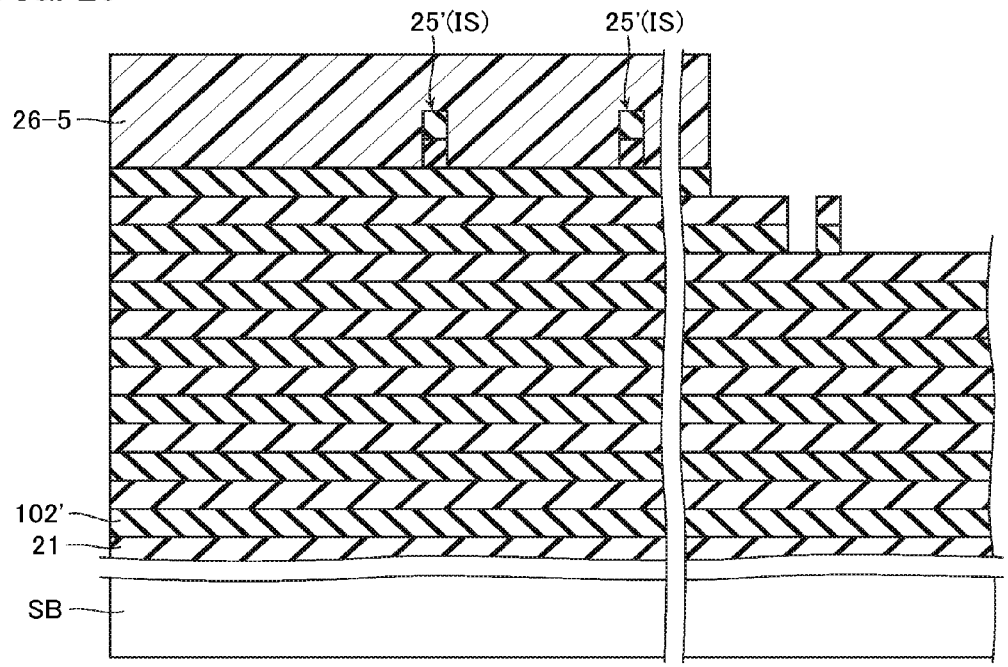

As shown in FIG. 26, the sacrifice film 102' exposed in an uppermost layer undergoes etching processing.

Figure 27:
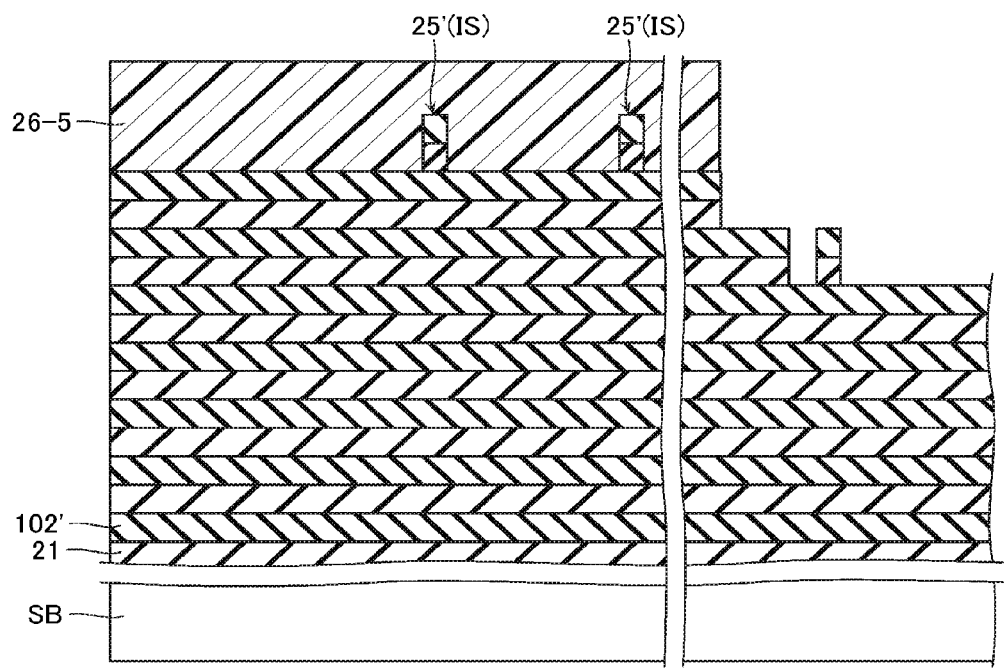

As shown in FIG. 27, the inter-layer insulating layer 21 exposed in an uppermost layer undergoes etching processing. In this way, a step difference of a second step portion is formed.

Then, similarly to in steps described by FIGS. 14 and 15 of the first embodiment, the resist 26-5 is once all removed. Then, although illustration thereof is omitted, patterning of a new resist is implemented by a lithography method so as to enable a resist boundary to be disposed at a desired position from the island structure IS positioned next at an end, in other words, the island structure IS next furthest from the memory cell region MAR.

Thereafter, the following processing is repeated, namely processing in which similar steps to the steps of FIGS. 23 to 27, that is, removal of the sacrifice film 102' and inter-layer insulating layer 21 and slimming of the resist, are performed a certain number of times, and then all of the resist is removed and similar steps are performed with reference to the next island structure IS.

Finally, planarization or wiring line formation, memory cell formation, and so on, are performed, the sacrifice film 102' is replaced by the likes of a metal to configure the conductive layer 102, and the configuration of FIG. 19 is obtained.

In this second embodiment also, similarly to in the first embodiment, the island structure IS is disposed in the non-wiring line region NLA of the peripheral region PR surrounding the memory cell region MAR. Moreover, the island structure IS is disposed close to the corner portion CR of each of the steps forming the stepped structure, and is disposed on both sides so as to sandwich the memory cell region MAR.

Moreover, in the present embodiment also, similarly to in the first embodiment, a length in a direction along the step boundary SBL of the stepped structure of the peripheral region PR of the island structure IS is configured shorter than a length in a direction (X direction and Y direction of FIG. 5A) along the SBL of a step where that island structure IS is disposed.

(Advantages)

This second embodiment also displays similar advantages to those of the first embodiment. Moreover, in the second embodiment, the island structure IS does not have a stepped structure. Therefore, an area required for formation of the island structure IS is reduced, and it becomes possible to form the island structure IS on a smaller area.

[Modified Examples]

Next, several modified examples will be described with reference to the drawings. In both of the first and second embodiments described above, the island structure IS had its leading edge in a shorter direction matched to the step boundary SBL of the stepped structure. However, as shown in, for example, FIG. 28A, it is also possible for the island structure IS to be formed such that its end in the shorter direction (X direction) protrudes more to an opposite side of the memory cell region MAR than the step boundary SBL of the stepped structure. This island structure IS shown in FIG. 28A can be formed by a similar method to in the first and second embodiments, but is obtained by, for example, etching back the inter-layer insulating layer 21 and the sacrifice film 102' positioned below the island structure IS in the step described by FIG. 14 of the first embodiment.

Figure 28A:
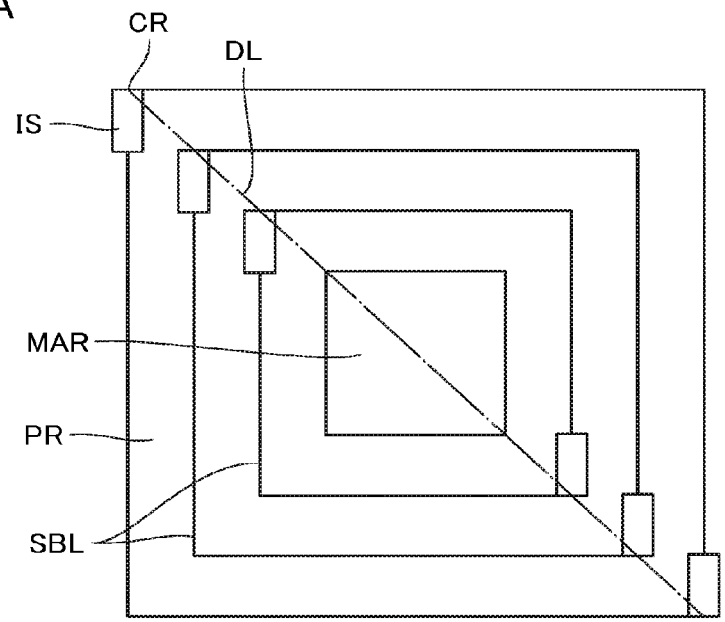
FIGS. 28A, 28B, 29A, 29B, 29C, and 30 to 35 show modified examples.
Figure 28B:
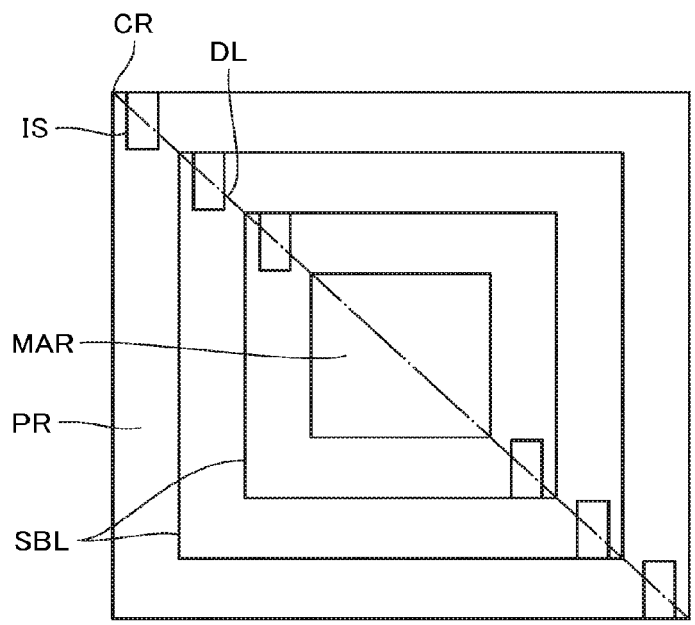

Moreover, as shown in FIG. 28B, it is also possible that, conversely to in FIG. 28A, the island structure IS is formed such that its end in the shorter direction (X direction) is positioned more to a memory cell region MAR side than the step boundary SBL of the stepped structure. The island structure IS shown in FIG. 28B is obtained by, for example, etching back only the island structure IS in the step of FIG. 14.

In addition, in both of FIGS. 28A and 28B, the island structures IS are disposed in the peripheral region PR on both sides sandwiching the memory cell region MAR of the substrate SB, so as to be aligned linearly closely following the diagonal line DL of the substrate. Moreover, more specifically, the island structures IS are disposed close to the corner portions CR of each of the steps configuring the stepped structure.

Note that the likes of the source contact LI or dashed lines indicating each of regions, and so on, shown in FIG. 5A, are omitted in FIGS. 28A and 28B.

In all of the above-described embodiments and modified examples, the island structures IS were disposed aligned linearly so as to closely follow the diagonal line DL of the substrate SB. However, it is also possible to adopt another arrangement.

Figure 29A:
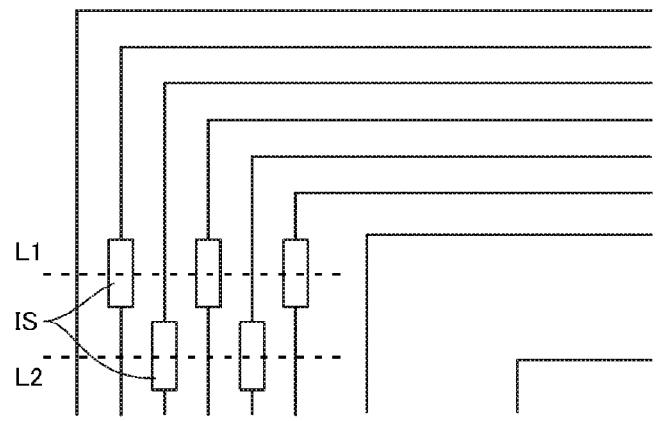

For example, it is also possible for a plurality of the island structures IS to be disposed alternately as shown in FIG. 29A. That is, in FIG. 29A, the plurality of island structures IS are disposed in two columns along two different straight lines L1 and L2 extending in a direction orthogonal to the step boundary of the stepped structure.

Figure 29B:
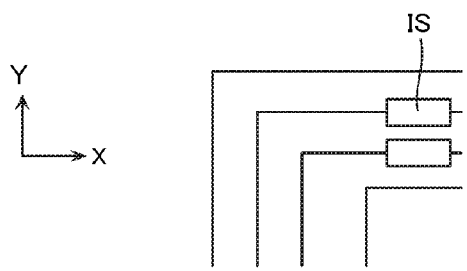
Figure 29C:
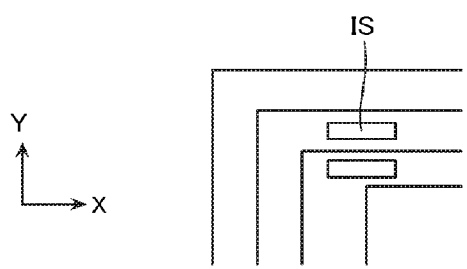

Moreover, in all of the above-described embodiments and modified examples, the island structure IS was formed on a wiring line region LA side (X direction side in FIG. 5A) where the wiring line connected to the memory cell array 1 is formed, of the peripheral region PR. However, as shown in FIGS. 29B or 29C, it is also possible for the island structure IS to be formed on a side (Y direction side) where the wiring line is not formed, of the peripheral region PR.

Figure 30:
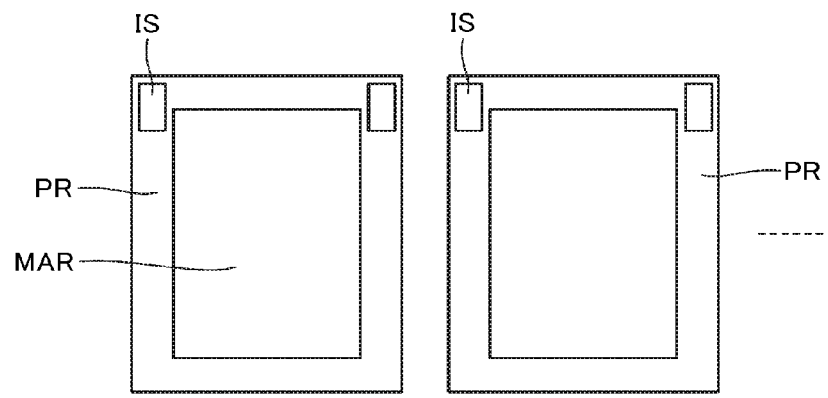

In addition, the above embodiments and modified examples described the island structure IS formed with respect to one memory cell region MAR. However, it is also possible that, for example, in a state where a plurality of memory cell regions MAR have been fabricated on a wafer substrate, the island structure IS is formed on both sides of each of the memory cell regions MAR as shown in FIG. 30.

Figure 31:
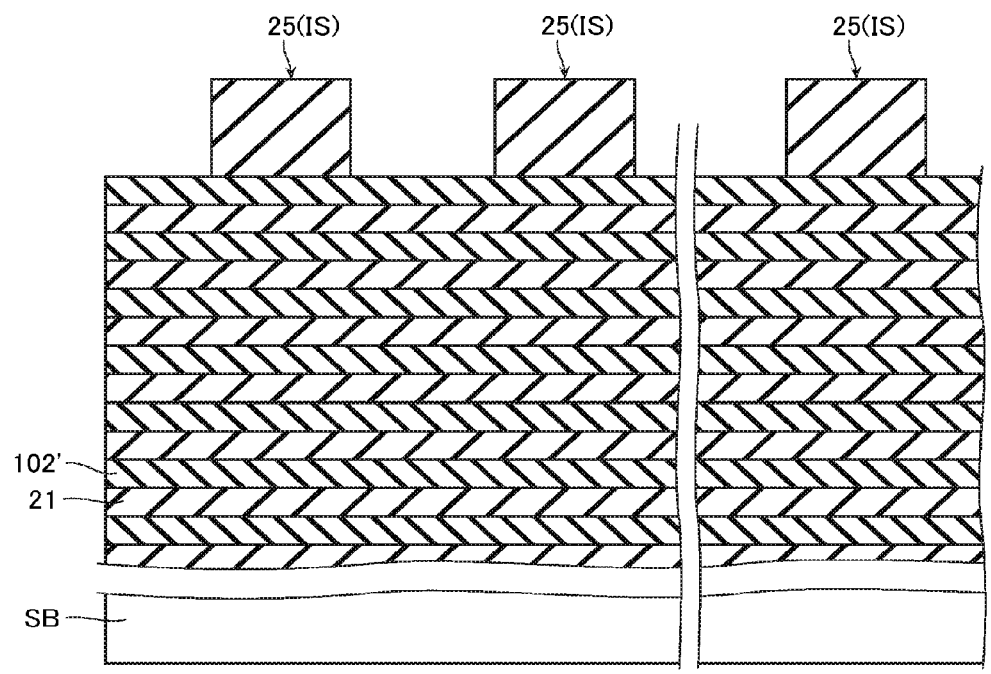

Described above was the case where the hard mask 25 shown in FIG. 6 was configured as silicon nitride and a pattern configured from a silicon nitride single layer of the kind shown in FIG. 7 was created to form the island structure IS. However, the basic structure of the island structure IS is not limited to the case like FIG. 7. For example, as shown in FIG. 31, also possible is a structure where the hard mask 25 is configured as silicon oxide in the step shown in FIG. 6, and a pattern 25 configured from a silicon oxide single layer is disposed. Note that at this time, in FIG. 31, an uppermost layer of the stacked body is a silicon nitride layer, but a silicon oxide layer may also be employed.

Figure 32:
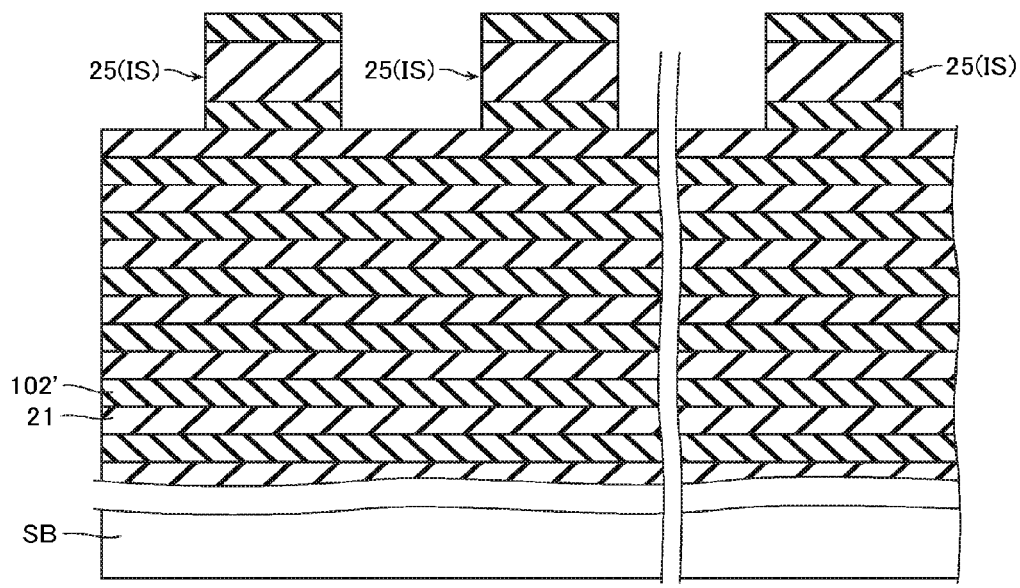

Moreover, as shown in FIG. 32, it is also possible for the hard mask 25 shown in FIG. 6 to be configured as a stacked structure of silicon nitride and silicon oxide and the basic pattern of the island structure IS to be configured as a stacked structure of silicon nitride and silicon oxide. In FIG. 32, there is a three-layer structure in which one silicon oxide layer is sandwiched by two silicon nitride layers, but it is of course also possible for a stacked structure other than this to be appropriately adopted.

Furthermore, in the above-described embodiments, the island structure IS had a stacked structure of the inter-layer insulating layer 21 configured from silicon oxide and the conductive layer 102 configured from a metal such as tungsten similarly to in the memory cell array (refer to FIGS. 5B and 18). However, as shown in, for example, FIG. 33, the configuration of the island structure IS may also be configured as a stacked structure of the sacrifice film (third layer) 102' configured from the likes of silicon nitride and the inter-layer insulating layer (fourth layer) 21 configured from silicon oxide.

Figure 33:
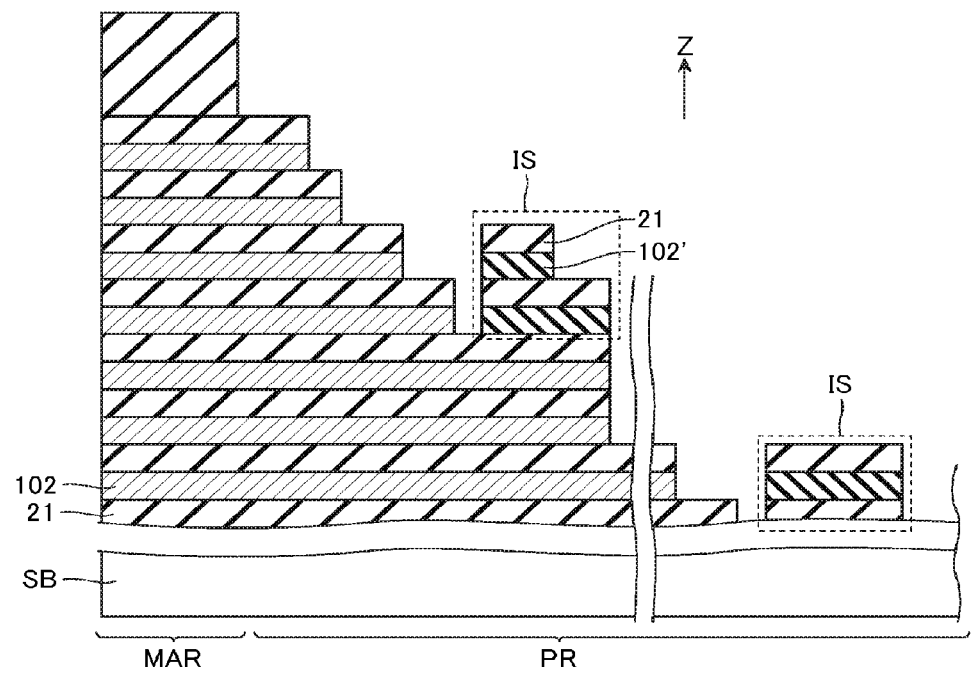

This configuration shown in FIG. 33 is obtained by forming the stepped structure and performing planarization or wiring line formation, memory cell formation, and so on, and then not performing in the island structure IS the replacement of the sacrifice film 102' by a metal film that was performed in the above-described embodiments.

Figure 34:
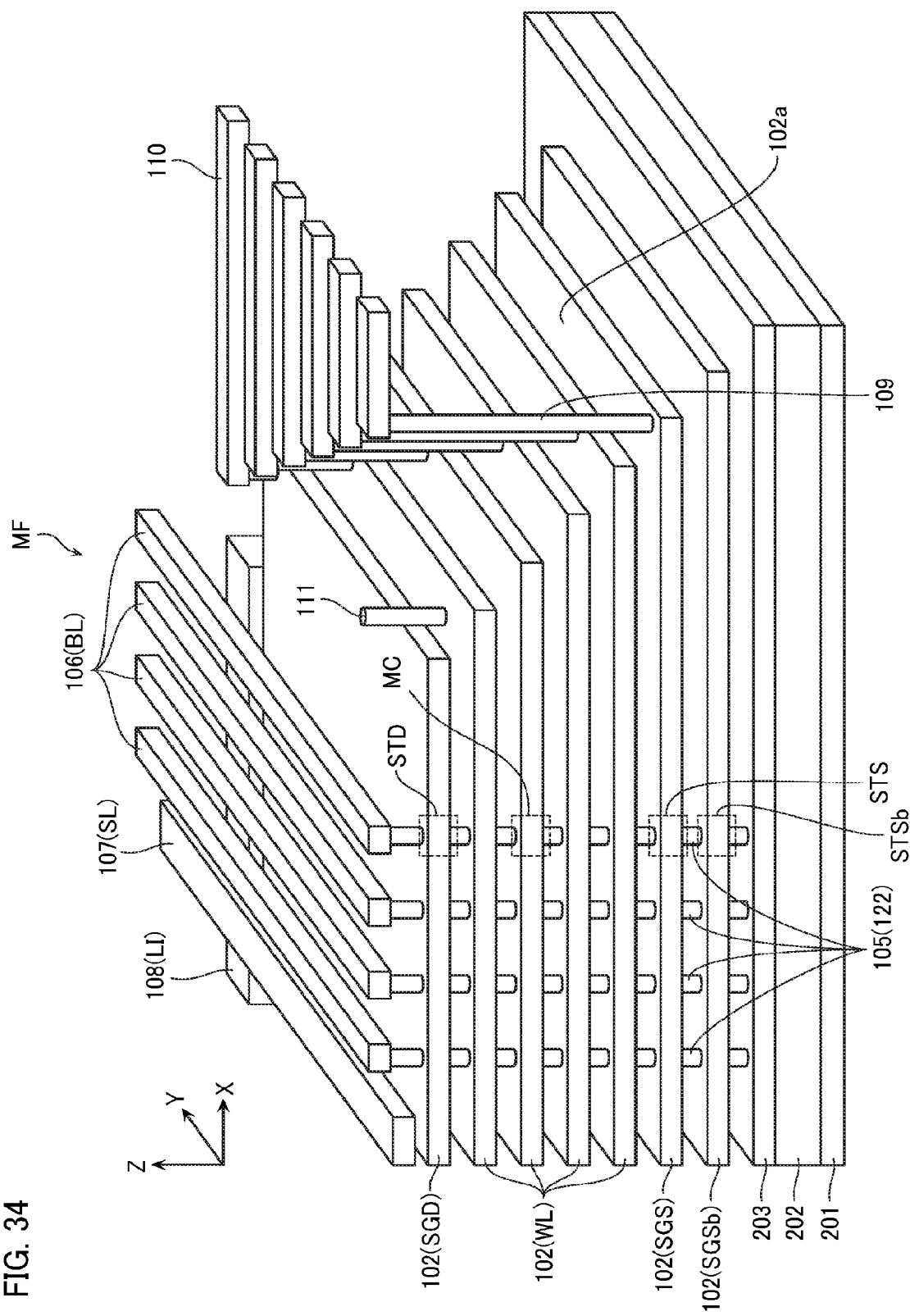

Moreover, as shown in FIG. 34, between the substrate 201 and the plurality of conductive layers 102, a circuit layer 202 and a conductive layer 203 can be provided. The substrate 201 is a semiconductor substrate. The circuit layer 202 includes, for example, FETs (Field Effect Transistors), wirings, and so on. The conductive layer 203 can be configured from a semiconductor layer of the likes of polysilicon, a metal layer of the likes of tungsten (W), or the like. The conductive layer 203 can be connected to lower end of the memory columnar body and the conductive layer 108 which functions as the source contact LI. Alternatively, the substrate 201 could be replaced by the semiconductor layer configured from silicon, etc., or the insulating layer configured from oxide silicon, etc.

Figure 35:
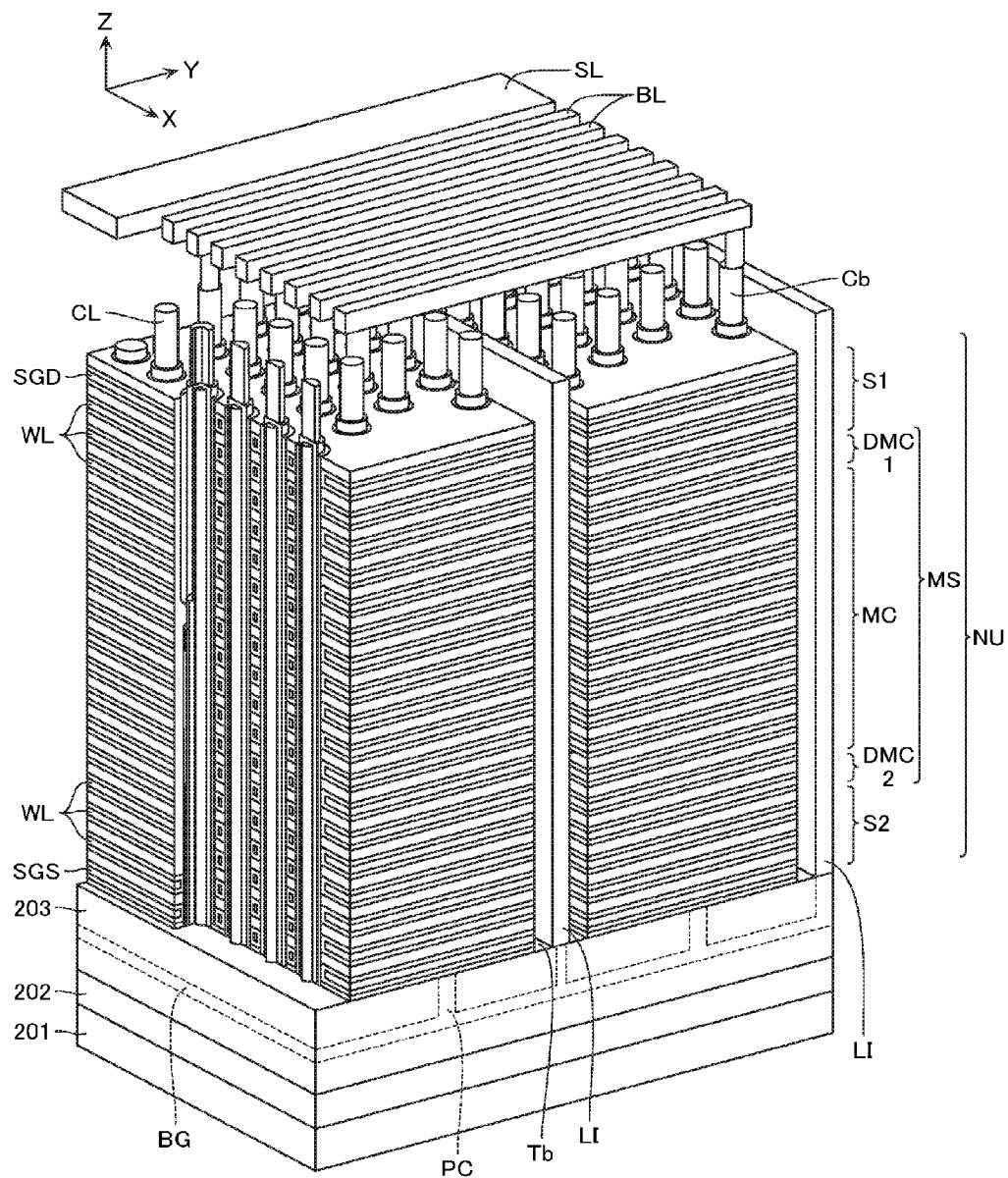

Furthermore, as shown in FIG. 35, in a case in which the structure as shown in FIG. 34 is used, wirings BG and wirings PC can be provided inside the substrate 203. The wirings BG connect the lower ends of the memory column body and the source contact LI. The wiring PC could be surrounded by the wirings BG. In this case, a memory film including floating gate configured from polysilicon or silicon nitride, etc., could be used, instead of the memory film including a charge accumulation film.

(Advantages)

All of the above-described modified examples also display similar advantages to those of the first and second embodiments. Moreover, in the arrangement described by FIG. 30, performing measurement of the above-described resist boundary in this state makes it possible to reduce deviation between each of the memory cell regions MAR.

As is clear from the above-described first and second embodiments and the modified examples, it is possible to adopt a variety of configurations and arrangement methods of the island structure IS functioning as a scale during stepped structure formation, according to an application, and so on.

For example, the configuration of the island structure IS was described above as a structure having a plurality of silicon nitride layers and silicon oxide layers stacked therein, but a single-layer structure configured from silicon nitride or silicon oxide may also be adopted.

Moreover, the island structure IS is not limited to the case of being disposed every several steps as in the above-described embodiments, and may be disposed every step.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above embodiments include the memory film including a charge accumulation film, however, the memory film is not limited to this type. Alternatively, a memory film including floating gate configured from polysilicon or silicon nitride, etc. could be used.

What is claimed is:

1. A nonvolatile semiconductor memory device, comprising:
   a semiconductor substrate;
   a memory cell region which has a plurality of first layers and a plurality of second layers stacked alternately in a first direction on the semiconductor substrate therein, and which has a memory cell disposed therein;
   a peripheral region disposed in at least part of a periphery of the memory cell region, the peripheral region including a first stepped structure which has the plurality of first layers and the plurality of second layers stacked alternately in the first direction therein and in which an end of a lower first layer is disposed further from the memory cell region than is an end of an upper first layer; and
   a second stepped structure which is disposed on the first stepped structure, which has a plurality of third layers and a plurality of fourth layers stacked alternately in the first direction therein, and in which an end of a lower third layer is disposed further from the memory cell region than is an end of an upper third layer,
   a length in a second direction orthogonal to the first direction of the second stepped structure being shorter than a length in the second direction of the first layer or the second layer contacted by the second stepped structure, and
   a length in a third direction orthogonal to the first direction and the second direction of the second stepped structure being shorter than a length in the third direction of the first layer or the second layer contacted by the second stepped structure.

2. The nonvolatile semiconductor memory device according to claim 1, wherein
   the first layer and the third layer include tungsten, and
   the second layer and the fourth layer include silicon oxide.

3. The nonvolatile semiconductor memory device according to claim 2, wherein
   the first layer and the third layer are electrically insulated.

4. The nonvolatile semiconductor memory device according to claim 1, wherein
   the first layer is a conductive layer, and
   the second through fourth layers are insulating layers.

5. The nonvolatile semiconductor memory device according to claim 4, wherein
   the first layer includes tungsten,
   the third layer includes silicon nitride, and
   the second layer and the fourth layer include silicon oxide.

6. The nonvolatile semiconductor memory device according to claim 1, wherein
   the first layer or the second layer is divided into a plurality of portions in the second direction.

7. The nonvolatile semiconductor memory device according to claim 6, wherein
   the first layer is a conductive layer,
   the peripheral region includes: a first region where the first layer is electrically connected to the memory cell; and a second region where the first layer is electrically insulated from the memory cell, and
   the second stepped structure is disposed in the second region.

8. The nonvolatile semiconductor memory device according to claim 1, wherein
   distances from the semiconductor substrate of one first layer included in the plurality of first layers and one third layer included in the plurality of third layers are equal.

9. The nonvolatile semiconductor memory device according to claim 1, wherein
   a length in the second direction of the second stepped structure is 5 µm or more.

10. The nonvolatile semiconductor memory device according to claim 1, wherein
    a plurality of the second stepped structures are disposed, and the plurality of second stepped structures are disposed along a first straight line.

11. The nonvolatile semiconductor memory device according to claim 1, wherein
    a plurality of the second stepped structures are disposed, at least one each of the second stepped structures are disposed on both sides sandwiching the memory cell region, and the second stepped structures are disposed in symmetrical positions sandwiching the memory cell region.

12. A method of manufacturing a nonvolatile semiconductor memory device, the nonvolatile semiconductor memory device including a first stepped structure which has a plurality of first layers and a plurality of second layers stacked alternately in a first direction therein and in which an end of a lower first layer is disposed further from a memory cell region which has a memory cell disposed therein than is an end of an upper first layer, the method comprising:
    forming a stacked body by alternately stacking the plurality of second layers and a plurality of third layers;
    forming a fourth layer in an upper portion of the stacked body;
    correspondingly disposing a resist in the upper portion of the fourth layer in a certain pattern;
    processing the fourth layer by etching, using the resist as a mask;
    disposing a resist on the stacked body and the fourth layer;
    processing at least the stacked body by etching, using the resist as a mask material;
    pushing back an end surface of the resist; and
    processing the stacked body by etching, using the pushed-back resist as a mask material.

13. The method of manufacturing a nonvolatile semiconductor memory device according to claim 12, wherein
    the certain pattern is disposed above the first stepped structure, and is correspondingly disposed in a second stepped structure protruding in the first direction.

14. The method of manufacturing a nonvolatile semiconductor memory device according to claim 13, wherein
    the second stepped structure includes the second layer and the third layer.

15. The method of manufacturing a nonvolatile semiconductor memory device according to claim 13, wherein
    a position for disposing the resist is determined based on measurement of a distance from the second stepped structure.

16. The method of manufacturing a nonvolatile semiconductor memory device according to claim 13, wherein
    a plurality of the second stepped structures are formed.

17. The method of manufacturing a nonvolatile semiconductor memory device according to claim 13, wherein
    a peripheral region disposed in at least part of a periphery of the memory cell region, is configured from: a wiring line region where a wiring line connected to the memory cell is disposed; and a non-wiring line region where the wiring line is not disposed, the peripheral region including the first stepped structure, and
    the second stepped structure is formed in the non-wiring line region.

18. The method of manufacturing a nonvolatile semiconductor memory device according to claim 13, wherein
    a plurality of the second stepped structures are formed, and
    at least one of the plurality of second stepped structures are disposed on both sides sandwiching the memory cell region, respectively.

19. A method of measuring a nonvolatile semiconductor memory device,
    the nonvolatile semiconductor memory device comprising:
    a memory cell region that includes a memory cell array, the memory cell array having a plurality of memory cells stacked on a substrate to be connected in series therein and having a structure in which a plurality of first layers and second layers are alternately stacked therein; and
    a peripheral region surrounding the memory cell region on the substrate, the peripheral region having a structure in which the plurality of first layers and second layers are alternately stacked therein and having a first stepped structure, wherein
    the first stepped structure in the peripheral region includes a second stepped structure, in which a proximity of a tip of at least one step in the first stepped structure protrudes in a direction in which the plurality of first layers and second layers are alternately stacked, height of the second stepped structure increasing as the memory cell region is approached, and includes a protruding portion in which a length in a direction parallel to a step boundary where a step height of the first stepped structure changes is shorter than a length in the direction of the step, and
    a resist being disposed on the structure in which the plurality of first layers and second layers are alternately stacked, and
    the first stepped structure and the second stepped structure are formed by removing the first layer and the second layer, the first layer and the second layer being exposed by pushing back an end surface of the resist, wherein
    a position for disposing the resist on the structure in which the plurality of first layers and second layers are alternately stacked is determined by measuring a distance from the protruding portion.

20. The method of measuring according to claim 19, wherein
    at least one of the protruding portions are formed on both sides sandwiching the memory cell region, respectively, and
    measurement of the distance from the protruding portion if disposing the resist is performed simultaneously with reference to each of the protruding portions at least one of which are disposed on both sides of the memory cell region.

* * * * *